US011990452B2

(12) United States Patent
Kim et al.

(10) Patent No.: US 11,990,452 B2
(45) Date of Patent: May 21, 2024

(54) SEMICONDUCTOR PACKAGE

(71) Applicant: Samsung Electronics Co., Ltd., Suwon-si (KR)

(72) Inventors: Namhoon Kim, Gunpo-si (KR); Chajea Jo, Yongin-si (KR); Ohguk Kwon, Asan-si (KR); Hyoeun Kim, Cheonan-si (KR); Seunghoon Yeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/120,587

(22) Filed: Mar. 13, 2023

(65) Prior Publication Data

US 2023/0215842 A1    Jul. 6, 2023

Related U.S. Application Data

(63) Continuation of application No. 17/178,327, filed on Feb. 18, 2021, now Pat. No. 11,626,385.

(30) Foreign Application Priority Data

Jul. 13, 2020    (KR) .................. 10-2020-0086234

(51) Int. Cl.
*H01L 25/065* (2023.01)
*H01L 23/00* (2006.01)

(52) U.S. Cl.
CPC .......... *H01L 25/0657* (2013.01); *H01L 24/02* (2013.01); *H01L 25/0652* (2013.01); *H01L 2224/02372* (2013.01); *H01L 2225/06513* (2013.01); *H01L 2225/06541* (2013.01); *H01L 2225/06586* (2013.01); *H01L 2225/06589* (2013.01); *H01L 2924/18161* (2013.01)

(58) Field of Classification Search
CPC .................................................. H01L 25/0657
See application file for complete search history.

(56) References Cited

U.S. PATENT DOCUMENTS

| | | | |
|---|---|---|---|
| 5,620,131 A | 4/1997 | Kane et al. | |
| 5,872,399 A | 2/1999 | Lee | |
| 6,878,633 B2 | 4/2005 | Raskin et al. | |
| 8,766,441 B2 | 7/2014 | Chang et al. | |
| 9,478,521 B2 | 10/2016 | Chen et al. | |
| 9,484,291 B1 * | 11/2016 | Dhandapani | H01L 24/03 |
| 9,754,860 B2 | 9/2017 | Molin et al. | |
| 10,497,660 B2 | 12/2019 | Chen | |

(Continued)

FOREIGN PATENT DOCUMENTS

KR    100691151 B1    3/2007
KR    101445766 B1    10/2014

*Primary Examiner* — William A Harriston
(74) *Attorney, Agent, or Firm* — Muir Patent Law, PLLC

(57) ABSTRACT

A semiconductor package includes a first semiconductor chip comprising a semiconductor substrate and a redistribution pattern on a top surface of the semiconductor substrate, the redistribution pattern having a hole exposing an inner sidewall of the redistribution pattern, a second semiconductor chip on a top surface of the first semiconductor chip, and a bump structure disposed between the first semiconductor chip and the second semiconductor chip. The bump structure is disposed in the hole and is in contact with the inner sidewall of the redistribution pattern.

18 Claims, 12 Drawing Sheets

(56) References Cited

U.S. PATENT DOCUMENTS

| | | |
|---|---|---|
| 10,553,538 B2 | 2/2020 | Reingruber et al. |
| 2008/0088031 A1 | 4/2008 | Kwon et al. |
| 2012/0012997 A1 | 1/2012 | Shen et al. |
| 2013/0241052 A1* | 9/2013 | Chang .................... H01L 24/19 257/737 |
| 2020/0083152 A1 | 3/2020 | Hsiao et al. |

* cited by examiner

US 11,990,452 B2

SEMICONDUCTOR PACKAGE

CROSS-REFERENCE TO RELATED APPLICATION

This U.S. non-provisional patent application is a continuation of U.S. patent application Ser. No. 17/178,327, filed Feb. 18, 2021, which claims priority under 35 U.S.C. § 119 to Korean Patent Application No. 10-2020-0086234, filed on Jul. 13, 2020, in the Korean Intellectual Property Office, the disclosures of both of which are hereby incorporated by reference in their entireties.

BACKGROUND

Embodiments of the inventive concepts relate to a semiconductor package and, more particularly, to a semiconductor package including a bump structure.

Techniques of stacking semiconductor chips have been developed to improve integration densities and performance of semiconductor devices. For example, in a multi-chip package technique, a plurality of semiconductor chips may be mounted in a single semiconductor package. In a system-in-package technique, different kinds of semiconductor chips may be stacked in a single semiconductor package capable of operating as one system. A reduction in thickness of a semiconductor package may be required to miniaturize an electronic device. In addition, a semiconductor package may be required to have a heat dissipation property capable of effectively dissipating heat generated from stacked semiconductor chips in operation of the semiconductor package.

SUMMARY

Embodiments of the inventive concepts may provide a miniaturized semiconductor package.

Embodiments of the inventive concepts may also provide a semiconductor package capable of reducing a distance between stacked semiconductor chips and improving thermal properties.

In an aspect, a semiconductor package may include a first semiconductor chip comprising a semiconductor substrate and a redistribution pattern on a top surface of the semiconductor substrate, the redistribution pattern having a hole exposing an inner sidewall of the redistribution pattern, a second semiconductor chip on a top surface of the first semiconductor chip, and a bump structure disposed between the first semiconductor chip and the second semiconductor chip. The bump structure may be disposed in the hole and may be in contact with the inner sidewall of the redistribution pattern.

In an aspect, a semiconductor package may include a first semiconductor chip comprising a semiconductor substrate and a redistribution pattern disposed on a top surface of the semiconductor substrate, the redistribution pattern having a hole, a second semiconductor chip on a top surface of the first semiconductor chip, a solder pattern provided in the hole so as to be in contact with an inner sidewall of the redistribution pattern, and a pillar pattern disposed between the solder pattern and the second semiconductor chip.

In an aspect, a semiconductor package may include a package substrate, a first semiconductor chip mounted on the package substrate, a second semiconductor chip disposed on a top surface of the first semiconductor chip, and a bump structure disposed between the first semiconductor chip and the second semiconductor chip. The first semiconductor chip may include a first semiconductor substrate, a first circuit layer disposed on a bottom surface of the first semiconductor substrate and comprising first integrated circuits, a first through-structure disposed in the first semiconductor substrate, a first redistribution pattern disposed on a top surface of the first semiconductor substrate and connected to the first through-structure, a first protective layer on a top surface of the first redistribution pattern, and an upper insulating layer between the first semiconductor substrate and the first redistribution pattern. The second semiconductor chip may include a second semiconductor substrate, a second circuit layer disposed on a bottom surface of the second semiconductor substrate and comprising second integrated circuits, and a chip pad disposed on a bottom surface of the second circuit layer and electrically connected to the second integrated circuits. The first redistribution pattern may have a hole exposing an inner sidewall of the first redistribution pattern. The bump structure may include a solder pattern provided in the hole so as to be in contact with the inner sidewall of the first redistribution pattern, and a pillar pattern between the solder pattern and the chip pad of the second semiconductor chip.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
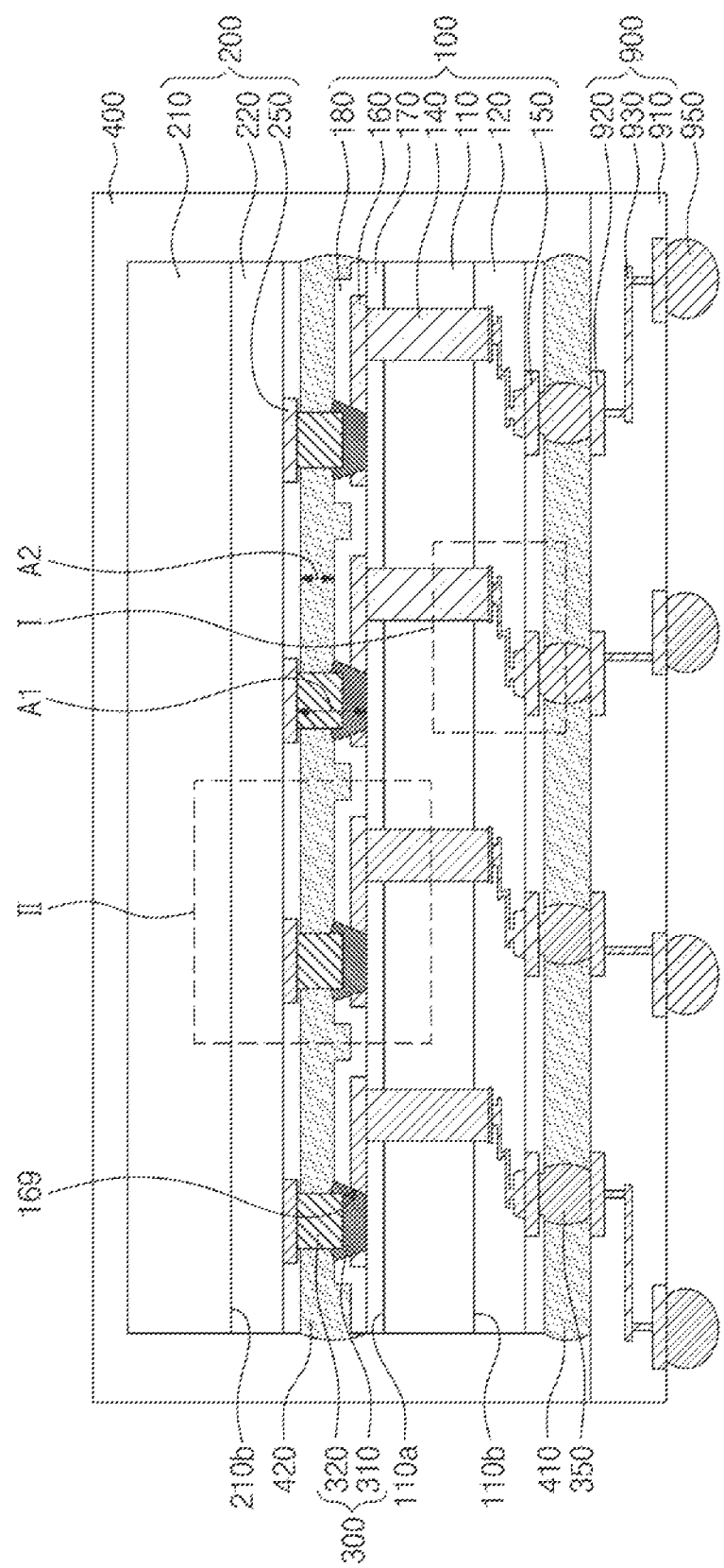
FIG. 1A is a cross-sectional view illustrating a semiconductor package, according to example embodiments of the inventive concepts.

The same reference numerals or the same reference designators may denote the same elements or components throughout the specification.

Semiconductor packages according to example embodiments of the inventive concepts will be described hereinafter.

Figure 1B:
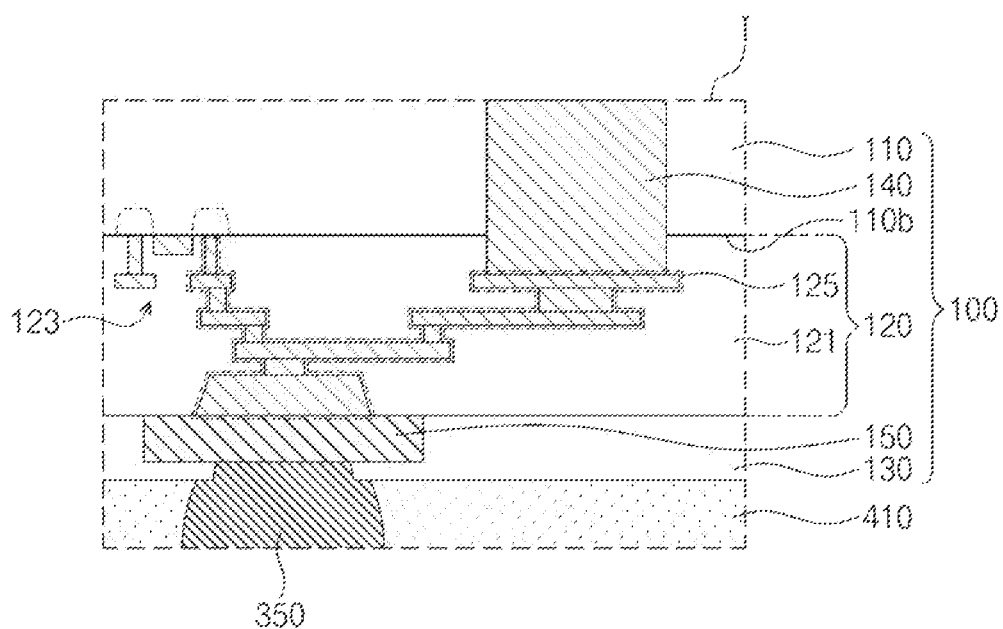
FIG. 1B is an enlarged view of a region 'I' of FIG. 1A.
Figure 1C:
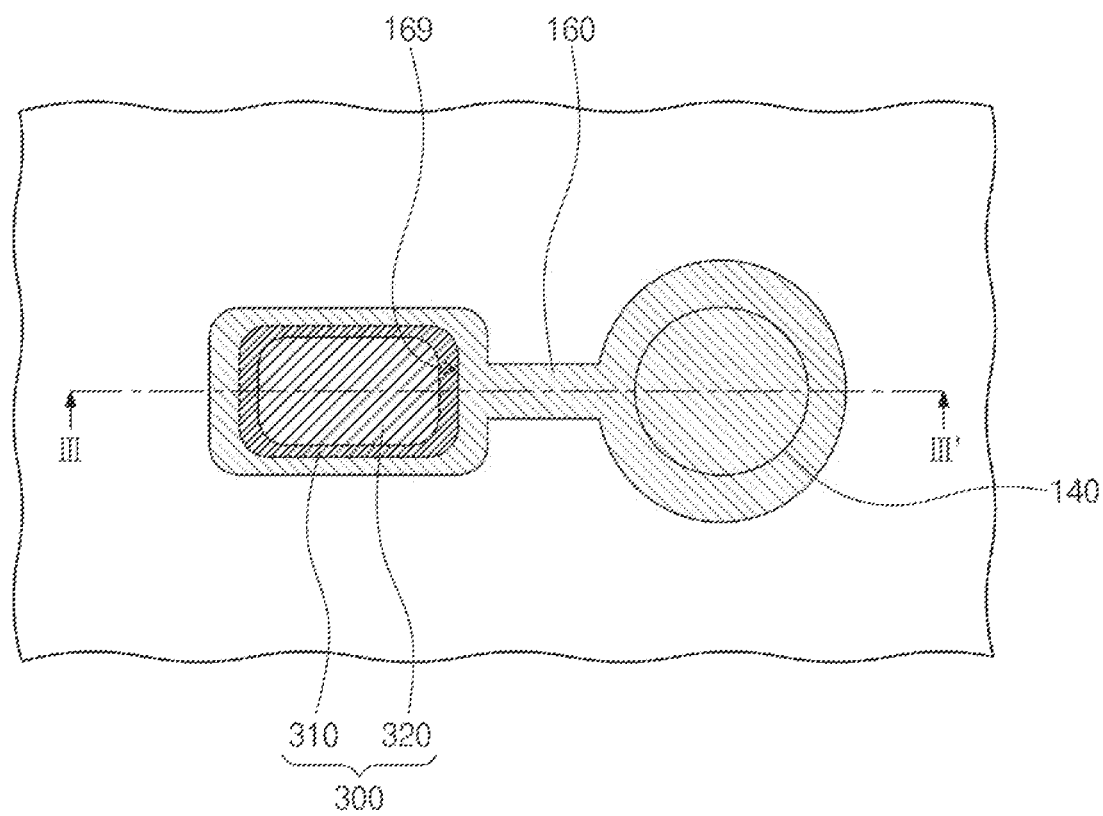
FIG. 1C is a plan view illustrating arrangement of a bump structure, a first redistribution pattern and a through-structure, according to example embodiments of the inventive concepts.
Figure 1D:
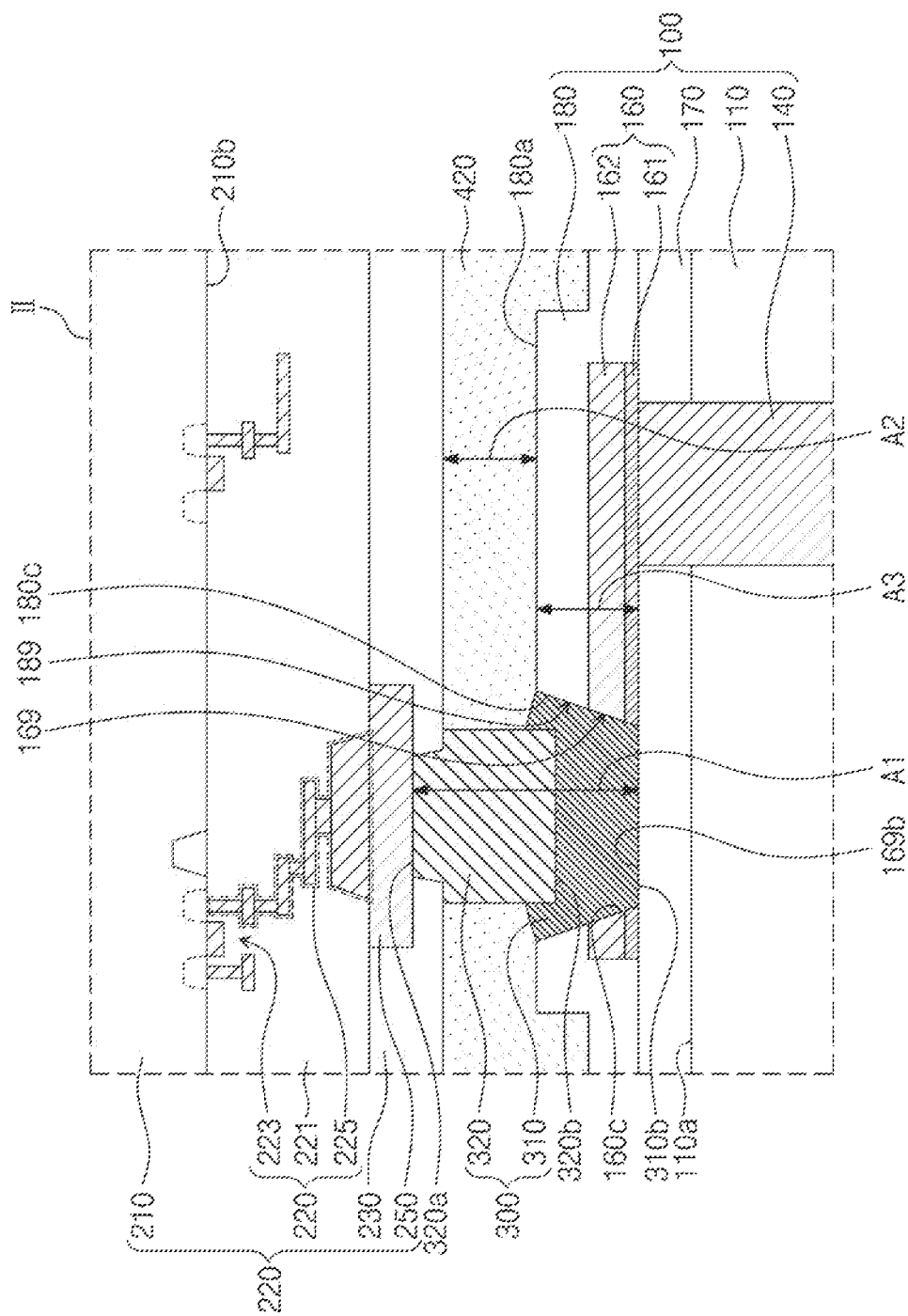
FIG. 1D is an enlarged view of a region 'II' of FIG. 1A and corresponds to a cross-sectional view taken along a line III-III' of FIG. 1C.

FIG. 1A is a cross-sectional view illustrating a semiconductor package, according to example embodiments of the inventive concepts. FIG. 1B is an enlarged view of a region 'I' of FIG. 1A. FIG. 1C is a plan view illustrating arrangement of a bump structure, a first redistribution pattern and a through-structure, according to example embodiments of the inventive concepts. FIG. 1D is an enlarged view of a region 'II' of FIG. 1A and corresponds to a cross-sectional view taken along a line III-III' of FIG. 1C.

Referring to FIGS. 1A, 1B, 1C, and 1D, a semiconductor package may include a first semiconductor chip 100, a second semiconductor chip 200, and a bump structure 300. The semiconductor package may further include a package substrate 900 and external terminals 950. The package substrate 900 may include an insulating base layer 910, substrate pads 920, and internal interconnection lines 930. The insulating base layer 910 may include a single layer or a plurality of layers. The substrate pads 920 may be exposed at a top surface of the package substrate 900. Top surfaces of the substrate pads 920 may be coplanar with a top surface of the package substrate 900. Otherwise, the top surfaces of the substrate pads 920 may be disposed at a different level from the top surface of the package substrate 900. The internal interconnection lines 930 may be disposed in the insulating base layer 910 and may be connected to the substrate pads 920. In the present specification, it will be understood that when a component is referred to as being "electrically connected" to another component, it may be connected directly to the other component or an intervening component may be present. In the present specification, it will be understood that when a component is referred to as being electrically connected to the package substrate 900, it may be electrically connected to the internal interconnection line 930. The substrate pads 920 and the internal interconnection lines 930 may include a metal such as copper, aluminum, tungsten, and/or titanium. For example, the package substrate 900 may be a printed circuit board having a circuit pattern. Alternatively, a redistribution layer may be used as the package substrate 900. When the redistribution layer is used as the package substrate 900, the insulating base layer 910 may include a photosensitive polymer or a photoimageable dielectric (PID) material. When the redistribution layer is used as the package substrate 900, the internal interconnection lines 930 may include a seed layer and a metal layer on the seed layer.

The external terminals 950 may be provided on a bottom surface of the package substrate 900 and may be connected to the internal interconnection line 930. For example, the external terminals 950 may be in contact with lower substrate pads 940, which may be exposed at a bottom surface of the package substrate 900. External electrical signals may be transmitted to the internal interconnection line 930 through the external terminal 950. The external terminal 950 may include a solder ball. The external terminal 950 may include a metal such as a solder material. The solder material may include tin (Sn), silver (Ag), zinc (Zn), and/or any alloy thereof.

The terms "contact" or "in contact with," as used herein, refer to a direct connection (i.e., touching) unless the context indicates otherwise. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The first semiconductor chip 100 may be mounted on the top surface of the package substrate 900. The first semiconductor chip 100 may include a first semiconductor substrate 110, a first circuit layer 120, a first chip pad 150, a first through-structure 140, a first redistribution pattern 160, and a first protective layer 180. For example, the first semiconductor substrate 110 may include a semiconductor material such as silicon, germanium, or silicon-germanium. The first semiconductor substrate 110 may have a top surface 110a and a bottom surface 110b which are opposite to each other.

The first circuit layer 120 may be disposed on the bottom surface 110b of the first semiconductor substrate 110. The first circuit layer 120 may include a first insulating layer 121, first integrated circuits 123, and a first interconnection structure 125, as illustrated in FIG. 1B. The first integrated circuits 123 may be provided on the bottom surface 110b of the first semiconductor substrate 110. For example, the first integrated circuits 123 may include transistors. The first integrated circuits 123 may include a logic circuit, a memory circuit, and/or a combination thereof. The first insulating layer 121 may be disposed on the bottom surface 110b of the first semiconductor substrate 110 and may cover the first integrated circuits 123. Even though not shown in the drawings, the first insulating layer 121 may include a plurality of stacked layers. The first insulating layer 121 may include a silicon-containing insulating material. For example, the silicon-containing insulating material may include silicon oxide, silicon nitride, silicon oxynitride, and/or tetraethyl orthosilicate. The first interconnection structure 125 may be provided in the first insulating layer 121. The first interconnection structure 125 may be electrically connected to the first integrated circuits 123. In the present specification, it may be understood that when a component is referred to as being electrically connected to a semiconductor chip, it may be electrically connected to integrated circuits of the semiconductor chip. The first interconnection structure 125 may include an interconnection pattern and a via pattern connected to the interconnection pattern. The interconnection pattern may have a long axis extending in a direction parallel to the bottom surface 110b of the first semiconductor substrate 110. A long axis of the via pattern may be parallel to a direction intersecting the bottom surface 110b of the first semiconductor substrate 110. The via pattern may be disposed between a plurality of the interconnection patterns and may be connected to the interconnection patterns. A width of each of the interconnection patterns may be greater than a width of the via pattern connected directly thereto. The first interconnection structure 125 may include a metal such as copper, aluminum, titanium, or tungsten.

The first chip pad 150 may be exposed at a bottom surface of the first semiconductor chip 100. The first chip pad 150 may be disposed on a bottom surface of the first circuit layer 120. The first chip pad 150 may be electrically connected to the first integrated circuits 123 through the first interconnection structure 125. The first chip pad 150 may include a different material from that of the first interconnection structure 125. The first chip pad 150 may include a metal such as aluminum. The first chip pad 150 may be a plurality of chip pads 150.

The first semiconductor chip 100 may further include a first lower insulating pattern 130, as illustrated in FIG. 1B. The first lower insulating pattern 130 may be provided on a bottom surface of the first insulating layer 121 and may cover an edge portion of the first chip pad 150. For example, the first lower insulating pattern 130 may contact side surfaces of the first chip pads 150, and the edge portion of a bottom surface of each first chip pad 150. The first lower insulating pattern 130 may expose at least a portion of the first chip pad 150. For example, the first lower insulating pattern 130 may expose a center portion of each first chip pad 150. The first lower insulating pattern 130 may include an insulating polymer or a silicon-based insulating material.

The semiconductor package may further include a bonding bump 350. As illustrated in FIG. 1A, the bonding bump 350 may be disposed between the package substrate 900 and the first semiconductor chip 100 and may be electrically connected to the package substrate 900 and the first semiconductor chip 100. For example, the bonding bump 350 may be connected to the substrate pad 920 and the first chip pad 150. The bonding bump 350 may contact a top surface of the substrate pad 920 and a bottom surface of the first chip pad 150. The bonding bump 350 may include a solder ball, a bump, or a pillar. The bonding bump 350 may include a conductive material. The bonding bump 350 may be a plurality of bonding bumps 350.

The first through-structure 140 may be disposed in the first semiconductor substrate 110. The first through-structure 140 may penetrate the top surface 110*a* and the bottom surface 110*b* of the first semiconductor substrate 110. The first through-structure 140 may further penetrate at least a portion of the first circuit layer 120. For example, the first through-structure 140 may further penetrate an upper portion of the first insulating layer 121, as illustrated in FIG. 1B. The first through-structure 140 may be electrically connected to at least one of the first chip pad 150 and the first integrated circuits 123 through the first interconnection structure 125. The first through-structure 140 may be a plurality of first through-structures 140, and each first through-structure 140 may be electrically connected to at least one corresponding first chip pad 150.

In FIGS. 1A and 1D, the first redistribution pattern 160 may be disposed on the top surface 110*a* of the first semiconductor substrate 110. In the present specification, it may be understood that when a component is referred to as being "on" another component, it may be directly on the other component or an intervening component may be present. For example, in some embodiments, a first upper insulating layer 170 may further be disposed between the top surface 110*a* of the first semiconductor substrate 110 and the first redistribution pattern 160. The first upper insulating layer 170 may include a silicon-containing insulating material. Even though not shown in the drawings, the first upper insulating layer 170 may include a plurality of stacked layers. If the first redistribution pattern 160 is in direct contact with the top surface 110*a* of the first semiconductor substrate 110, bonding strength between the first redistribution pattern 160 and the first semiconductor substrate 110 may be relatively weak. However, according to the embodiments, the first redistribution pattern 160 may be stably fixed to the first semiconductor substrate 110 by the first upper insulating layer 170.

The first redistribution pattern 160 may cover the first through-structure 140. For example, one end portion of the first redistribution pattern 160 may be disposed on a top surface of the first through-structure 140 and may be in contact with the top surface of the first through-structure 140. The first redistribution pattern 160 may be electrically connected to the first through-structure 140. Thus, the first redistribution pattern 160 may be electrically connected to the first integrated circuits 123 and the package substrate 900 through the first through-structure 140.

The first redistribution pattern 160 may have a first hole 169, as illustrated in FIG. 1D. The first hole 169 may penetrate a top surface of the first redistribution pattern 160 and may expose an inner sidewall 160*c* of the first redistribution pattern 160. The first hole 169 may further penetrate a bottom surface of the first redistribution pattern 160 to expose the first upper insulating layer 170 or the first semiconductor substrate 110. The first hole 169 may not vertically overlap with the first through-structure 140. In the present specification, the term "vertical" may mean "vertical to the top surface 110*a* of the first semiconductor substrate 110". Like FIG. 1C, the first hole 169 may be spaced apart from the first through-structure 140 when viewed in a plan view. The first hole 169 may have a rounded quadrilateral shape when viewed in a plan view. The planar shape of the first hole 169 may be variously modified. For example, the first hole 169 may have an octagonal shape or a circular shape when viewed in a plan view.

The first redistribution pattern 160 may include a seed pattern 161 and a conductive pattern 162. For example, the seed pattern 161 may include at least one of titanium or copper. The bottom surface of the first redistribution pattern 160 may mean a bottom surface of the seed pattern 161. The conductive pattern 162 may be disposed on the seed pattern 161, and may be in contact with a top surface of the seed pattern 161. The conductive pattern 162 may include a metal such as copper, nickel, or any alloy thereof. The conductive pattern 162 may be formed by an electroplating process using the seed pattern 161 as an electrode. A thickness of the conductive pattern 162 may be greater than a thickness of the seed pattern 161. Thickness may refer to the thickness or height measured in a direction perpendicular to the top surface 110*a* of the first semiconductor substrate 110. The top surface of the first redistribution pattern 160 may mean a top surface of the conductive pattern 162. For the purpose of ease and convenience in illustration, the seed pattern 161 and the conductive pattern 162 of the first redistribution pattern 160 are not separately illustrated in other drawings except FIG. 1D. However, the first redistribution pattern 160 may include the seed pattern 161 and the conductive pattern 162 in the other drawings.

The first protective layer 180 may be provided on the top surface 110*a* of the first semiconductor substrate 110. For example, the first protective layer 180 may cover the top surface and an outer sidewall of the first redistribution pattern 160 and a top surface of the first upper insulating layer 170. The first protective layer 180 may contact the top surface and an outer sidewall of the first redistribution pattern 160 and a top surface of the first upper insulating layer 170. The first protective layer 180 may be an organic insulating layer. For example, the first protective layer 180 may include a photosensitive polymer or a photoimageable dielectric material. For example, the photosensitive polymer or the photoimageable dielectric material may include at least one of photosensitive polyimide, polybenzoxazole, a phenol-based polymer, or a benzocyclobutene-based polymer. The first protective layer 180 may not extend into the first hole 169 of the first redistribution pattern 160. The first protective layer 180 may not cover the inner sidewall 160c of the first redistribution pattern 160. The first protective layer 180 may have a first opening 189. The first opening 189 may penetrate a top surface 180a and a bottom surface of the first protective layer 180. The first opening 189 may be connected to the first hole 169. The first opening 189 may expose an inner sidewall 180c of the first protective layer 180. The inner sidewall 180c of the first protective layer 180 may be coplanar with the inner sidewall 160c of the first redistribution pattern 160.

The second semiconductor chip 200 may be disposed on the first semiconductor chip 100. A kind of the second semiconductor chip 200 may be different from a kind of the first semiconductor chip 100. For example, the first semiconductor chip 100 may be a logic chip, and the second semiconductor chip 200 may be a memory chip. Alternatively, the kind of the second semiconductor chip 200 may be the same as the kind of the first semiconductor chip 100. For example, each of the first and second semiconductor chips 100 and 200 may be a memory chip. As illustrated in FIG. 1A, a width of the second semiconductor chip 200 may be equal to a width of the first semiconductor chip 100. Alternatively, the width of the second semiconductor chip 200 may be different from the width of the first semiconductor chip 100.

The second semiconductor chip 200 may include a second semiconductor substrate 210, a second circuit layer 220, and a second chip pad 250. The second semiconductor substrate 210 may include at least one of the materials described as the examples of the first semiconductor substrate 110. The second circuit layer 220 may be disposed on a bottom surface 210b of the second semiconductor substrate 210. The second circuit layer 220 may include a second insulating layer 221, second integrated circuits 223, and a second interconnection structure 225, as illustrated in FIG. 1D. The second integrated circuits 223 may be provided on the bottom surface 210b of the second semiconductor substrate 210. For example, the second integrated circuits 223 may include transistors. The second integrated circuits 223 may include a logic circuit, a memory circuit, and/or a combination thereof. The second insulating layer 221 may be provided on the bottom surface 210b of the second semiconductor substrate 210 and may cover the second integrated circuits 223. Even though not shown in the drawings, the second insulating layer 221 may include a plurality of stacked layers. The second insulating layer 221 may include a silicon-containing insulating material. The second interconnection structure 225 may be provided in the second insulating layer 221. The second interconnection structure 225 may be electrically connected to the second integrated circuits 223. The second interconnection structure 225 may include an interconnection pattern and a via pattern connected to the interconnection pattern. The interconnection pattern may have a long axis extending in a direction parallel to the bottom surface 210b of the second semiconductor substrate 210. A long axis of the via pattern may be parallel to a direction intersecting the bottom surface 210b of the second semiconductor substrate 210. The via pattern may be disposed between a plurality of the interconnection patterns and may be connected to the interconnection patterns. A width of each of the interconnection patterns may be greater than a width of the via pattern connected directly thereto. The second interconnection structure 225 may include a metal such as copper, aluminum, titanium, or tungsten.

The second chip pad 250 may be exposed at a bottom surface of the second semiconductor chip 200. The second chip pad 250 may be disposed on a bottom surface of the second circuit layer 220. The second chip pad 250 may be electrically connected to the second integrated circuits 223 through the second interconnection structure 225. The second chip pad 250 may include a different material from that of the second interconnection structure 225. For example, the second chip pad 250 may include a metal such as aluminum.

The second semiconductor chip 200 may further include a second lower insulating pattern 230. The second lower insulating pattern 230 may be disposed on the bottom surface of the second circuit layer 220 and may expose the second chip pad 250. The second lower insulating pattern 230 may cover an edge portion of the second chip pad 250. For example, the second lower insulating pattern 230 may contact the bottom surface of the second circuit layer 220, a side surface of the second chip pad 250, and the edge portion of the bottom surface of the second chip pad 250. The second lower insulating pattern 230 may include a silicon-based insulating material or an insulating polymer.

The bump structure 300 may be disposed between the first and second semiconductor chips 100 and 200 and may be electrically connected to the first and second semiconductor chips 100 and 200. The bump structure 300 may include a solder pattern 310 and a pillar pattern 320. The solder pattern 310 may be provided in the first hole 169 of the first redistribution pattern 160 and may cover the inner sidewall 160c of the first redistribution pattern 160. For example, the solder pattern 310 may be in contact with the inner sidewall 160c of the first redistribution pattern 160. The solder pattern 310 may also be provided in the first opening 189 of the first protective layer 180 and may be in contact with the inner sidewall 180c of the first protective layer 180. The solder pattern 310 may include tin (Sn), silver (Ag), zinc (Zn), and/or any alloy thereof. A bottom surface 310b of the solder pattern 310 may correspond to a bottom surface of the bump structure 300. The bottom surface 310b of the solder pattern 310 may be disposed at a lower level than the top surface of the first redistribution pattern 160. In the present specification, the term "level" may mean a vertical level. A difference in level between two surfaces may be measured in a direction perpendicular to the top surface 110a of the first semiconductor substrate 110. In some embodiments, the bottom surface 310b of the solder pattern 310 may be coplanar with a bottom surface of the first redistribution pattern 160. A shape of the bottom surface 310b and a sidewall of the solder pattern 310 may correspond to a shape of a bottom surface 169b and a sidewall of the first hole 169. As illustrated in FIG. 1C, a planar shape of the solder pattern 310 may correspond to the planar shape of the first hole 169. The solder pattern 310 may have a rounded quadrilateral shape when viewed in a plan view. The planar shape of the solder pattern 310 may be variously modified. For example, the solder pattern 310 may have an octagonal shape or a circular shape when viewed in a plan view.

The pillar pattern 320 may be disposed between the solder pattern 310 and the second semiconductor chip 200. For example, the pillar pattern 320 may be disposed between the solder pattern 310 and the second chip pad 250 and may be connected to the solder pattern 310 and the second chip pad 250. A lower portion of the pillar pattern 320 may be surrounded by the solder pattern 310. For example, a bottom surface 320b of the pillar pattern 320 may be in contact with the solder pattern 310. A sidewall of the lower portion of the pillar pattern 320 may be covered by the solder pattern 310. For example, the sidewall of the lower portion of the pillar pattern 320 may be in contact with the solder pattern 310.

However, embodiments of the inventive concepts are not limited thereto. At least a portion of the pillar pattern 320 may be provided in the first opening 189. For example, the bottom surface 320b of the pillar pattern 320 may be disposed at a lower level than the top surface 180a of the first protective layer 180. Thus, a height A1 of the bump structure 300 may be reduced. A width of the pillar pattern 320 may be substantially uniform. A top surface 320a of the pillar pattern 320 may correspond to a top surface of the bump structure 300. The pillar pattern 320 may include a conductive material such as copper. As illustrated in FIG. 1C, the pillar pattern 320 may have a rounded quadrilateral shape when viewed in a plan view. Alternatively, the pillar pattern 320 may have an octagonal shape or a circular shape when viewed in a plan view. Electrical connection between the first and second semiconductor chips 100 and 200 and the bump structure 300 will be described hereinafter.

Figure 1E:
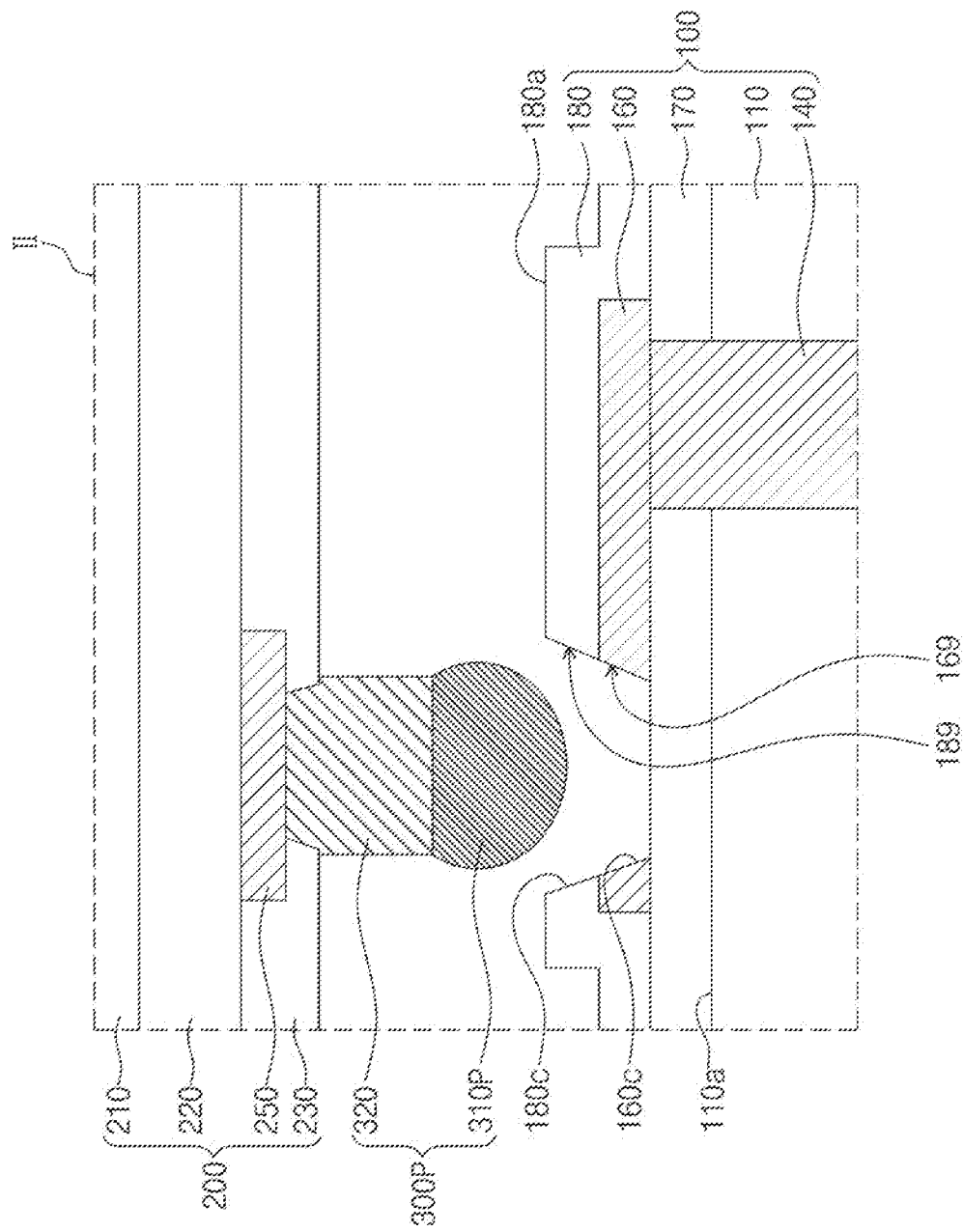
FIG. 1E is a cross-sectional view illustrating a process of electrically connecting first and second semiconductor chips.

FIG. 1E is an enlarged view corresponding to the region 'II' of FIG. 1A to illustrate a process of electrically connecting first and second semiconductor chips. In FIG. 1E, the first integrated circuits and the first interconnection structure are omitted for the purpose of ease and convenience in illustration.

Referring to FIG. 1E, a second semiconductor chip 200 may be prepared. The second semiconductor chip 200 may include the second semiconductor substrate 210, the second circuit layer 220, the second chip pad 250, and the second lower insulating pattern 230, as described above. At this time, a preliminary bump structure 300P may be formed on the second chip pad 250 of the second semiconductor chip 200. The preliminary bump structure 300P may include a pillar pattern 320 and a preliminary solder pattern 310P. The preliminary solder pattern 310P may have a solder ball shape. For example, a lower portion of the preliminary solder pattern 310P may have a shape such as a hemisphere. The second semiconductor chip 200 may be disposed on the first semiconductor chip 100 in such a way that the preliminary solder pattern 310P is provided in the first hole 169 of the first redistribution pattern 160. A reflow process of the preliminary solder pattern 310P may be performed. The reflow process may be performed at a temperature equal to or higher than a melting point of the preliminary solder pattern 310P. However, embodiments of the inventive concepts are not limited thereto. Even though a central axis of the preliminary bump structure 300P may be offset from a central axis of the first hole 169 by a process error, since the preliminary solder pattern 310P is provided in the first hole 169, the solder pattern 310 may be in good contact with the inner sidewall 160c of the first redistribution pattern 160 after completion of the reflow process. As a result, the bump structure 300 described in FIGS. 1A to 1D may be formed, and the first and second semiconductor chips 100 and 200 may be electrically connected to each other through the bump structure 300. As illustrated in FIG. 1A, the bump structure 300 may include a plurality of bump structures 300 laterally spaced apart from each other. The first hole 169 may include a plurality of first holes 169 separated from each other. If the first holes 169 are omitted, in the reflow process, a plurality of the preliminary solder patterns 310P may have flowability and thus may come in contact with each other. In this case, an electrical short may occur between the bump structures 300. However, according to the embodiments, the first holes 169 may physically isolate the preliminary solder patterns 310P, respectively. Since each of the preliminary solder patterns 310P is provided in a corresponding one of the first holes 169, the preliminary solder patterns 310P may not come in contact with each other even though they have flowability. Thus, it is possible to prevent occurrence of an electrical short between a plurality of the solder patterns 310. As a result, reliability of the bump structure 300 and the semiconductor package including the same may be improved.

Referring again to FIGS. 1A to 1D, the bump structure 300 may be electrically connected to the first through-structure 140 through the first redistribution pattern 160. Since the first redistribution pattern 160 is provided, the bump structure 300 and the first through-structure 140 may not be vertically aligned with each other. Thus, arrangement of the bump structure 300 and the first through-structure 140 may be freely designed.

A molding layer 400 may be disposed on the top surface of the package substrate 900 to cover the first semiconductor chip 100 and the second semiconductor chip 200. Unlike FIG. 1A, in some embodiments, the molding layer 400 may cover sidewalls of the first and second semiconductor chips 100 and 200 but may expose a top surface of the second semiconductor chip 200. The molding layer 400 may include an insulating polymer such as an epoxy molding compound (EMC).

A first underfill layer 410 may be provided in a first gap region between the package substrate 900 and the first semiconductor chip 100 to seal or surround the bonding bump 350. The first underfill layer 410 may include an insulating polymer such as an epoxy molding compound (EMC). In some embodiments, the first underfill layer 410 may include a different material from that of the molding layer 400.

A second underfill layer 420 may be provided in a second gap region between the top surface of the first semiconductor chip 100 and the bottom surface of the second semiconductor chip 200. The second underfill layer 420 may seal or surround the bump structure 300. The second underfill layer 420 may cover a sidewall of the pillar pattern 320. The second underfill layer 420 may include an insulating polymer such as an epoxy molding compound (EMC). However, the second underfill layer 420 may include a different material from that of the molding layer 400. For example, the insulating polymer of the second underfill layer 420 may have a different chemical structure, number average molecular weight, substituted group or composition ratio from that of the insulating polymer of the molding layer 400.

If the first hole 169 and the first opening 189 are omitted, the bottom surface of the bump structure 300 may be disposed at the same level as or a higher level than the top surface 180a of the first protective layer 180. In this case, a distance A2 between the first and second semiconductor chips 100 and 200 may be equal to or greater than the height A1 of the bump structure 300. However, according to the embodiments, since a portion of the bump structure 300 is provided in the first hole 169, the distance A2 between the first and second semiconductor chips 100 and 200 may be less than the height A1 of the bump structure 300. Thus, the distance A2 between the first and second semiconductor chips 100 and 200 may be reduced, and a height of the semiconductor package may be reduced. Here, the distance A2 between the first and second semiconductor chips 100 and 200 may be a distance between a bottom surface of the second lower insulating pattern 230 and the top surface 180a of the first protective layer 180 disposed on the first redistribution pattern 160. The distance A2 between the first and second semiconductor chips 100 and 200 may be substantially equal to a thickness of the second underfill layer 420. The thickness of the second underfill layer 420 may correspond to a thickness of the second underfill layer 420 disposed on the top surface 180a of the first protective layer 180 disposed on the first redistribution pattern 160. In other words, the thickness of the second underfill layer 420 may be measured at a position vertically overlapping with the first redistribution pattern 160. The height A1 of the bump structure 300 may be defined as a distance between the top surface 320a of the pillar pattern 320 and the bottom surface 310b of the solder pattern 310. The thickness of the second underfill layer 420 may be less than the distance between the top surface 320a of the pillar pattern 320 and the bottom surface 310b of the solder pattern 310.

If the height A1 of the bump structure 300 is greater than 30 μm, a height of the semiconductor package may be increased. In some embodiments, the height A1 of the bump structure 300 may range from about 5 μm to about 30 μm.

If the distance A2 between the first and second semiconductor chips 100 and 200 is greater than 20 μm, it may be difficult to miniaturize a semiconductor package. In some embodiments, the distance A2 between the first and second semiconductor chips 100 and 200 may range from about 3 μm to about 20 μm. Thus, the semiconductor package may be further miniaturized.

A sum of a depth of the first hole 169 and a depth of the first opening 189 may substantially correspond to a difference between the height A1 of the bump structure 300 and the distance A2 between the first and second semiconductor chips 100 and 200. The sum of the depth of the first hole 169 and the depth of the first opening 189 may be a difference A3 in level between the top surface 180a of the first protective layer 180 and the bottom surface 169b of the first hole 169. If the difference A3 in level between the top surface 180a of the first protective layer 180 and the bottom surface 169b of the first hole 169 is less than 2 μm, a sufficient reduction in height of the semiconductor package may be difficult even though the bump structure 300 is disposed in the first hole 169. If the difference A3 in level between the top surface 180a of the first protective layer 180 and the bottom surface 169b of the first hole 169 is greater than 20 μm, a sum of thicknesses of the first redistribution pattern 160 and the first protective layer 180 may be too great. In this case, it may be difficult to reduce a height of the first semiconductor chip 100. However, according to some embodiments, the difference A3 in level between the top surface 180a of the first protective layer 180 and the bottom surface 169b of the first hole 169 may range from about 2 μm to about 10 μm. Thus, the height (or thickness) of the semiconductor package may be reduced.

The second underfill layer 420 may have a relatively low thermal conductivity. For example, the thermal conductivity of the second underfill layer 420 may be lower than a thermal conductivity of the bump structure 300. Particularly, the thermal conductivity of the second underfill layer 420 may be lower than a thermal conductivity of the solder pattern 310 and a thermal conductivity of the pillar pattern 320. The thermal conductivity of the second underfill layer 420 may be lower than a thermal conductivity of the first redistribution pattern 160, a thermal conductivity of the first through-structure 140, a thermal conductivity of the second chip pad 250, and a thermal conductivity of the second interconnection structure 225. As the thickness of the second underfill layer 420 increases, a heat dissipation property of the semiconductor package may be deteriorated. For example, if the thickness of the second underfill layer 420 is greater than 20 μm, the heat dissipation property of the semiconductor package may be deteriorated. However, according to the embodiments, since the thickness of the second underfill layer 420 is reduced, heat generated from the first semiconductor chip 100 in operation of the semiconductor package may be rapidly released or dissipated to the outside. The thickness of the second underfill layer 420 may range from about 3 μm to about 20 μm. Thus, thermal properties of the semiconductor package may be improved.

Figure 2A:
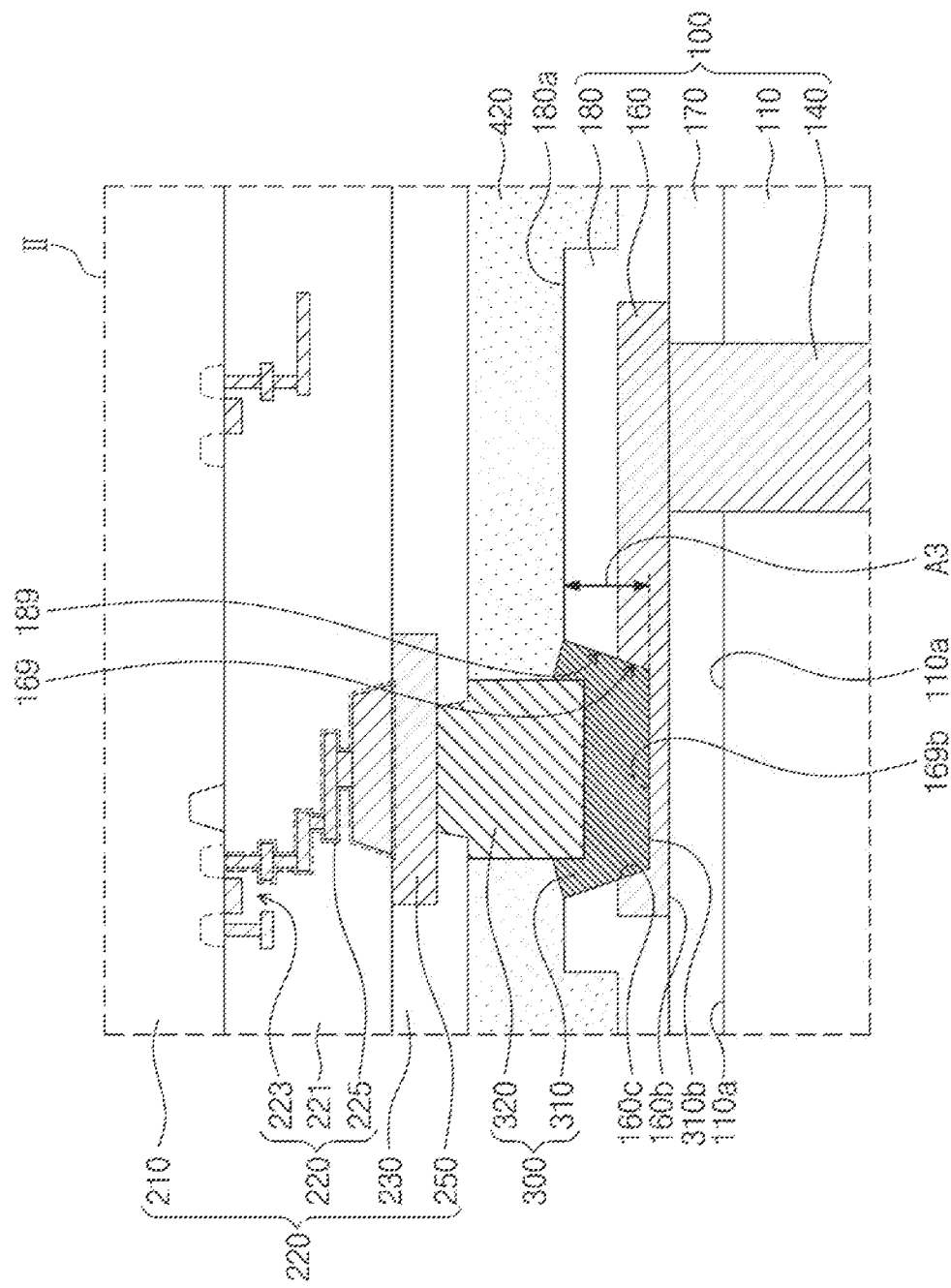
FIG. 2A is a view illustrating a bump structure and a first redistribution pattern, according to example embodiments of the inventive concepts.

FIG. 2A is a view illustrating a bump structure and a first redistribution pattern according to example embodiments of the inventive concepts. FIG. 2A is an enlarged view corresponding to the region 'II' of FIG. 1A and is a cross-sectional view corresponding to the line III-III' of FIG. 1C. Hereinafter, the descriptions to the same components and/or features as in the above embodiments will be omitted for the purpose of ease and convenience in explanation.

Referring to FIG. 2A, a semiconductor package may include a first semiconductor chip 100, a second semiconductor chip 200, and a bump structure 300. The first semiconductor chip 100 may include a first semiconductor substrate 110, a first through-structure 140, a first upper insulating layer 170, a first redistribution pattern 160, and a first protective layer 180. The first redistribution pattern 160 may be substantially the same as described with reference to FIGS. 1A to 1D. However, a first hole 169 may penetrate the top surface of the first redistribution pattern 160 but may not penetrate the bottom surface 160b of the first redistribution pattern 160. A bottom surface 169b of the first hole 169 may be provided in the first redistribution pattern 160. The bottom surface 169b of the first hole 169 may be at a higher level than the bottoms bottom surface 160b of the first redistribution pattern 160. Thus, the bottom surface 169b of the first hole 169 may expose the first redistribution pattern 160. A difference A3 in level between the top surface 180a of the first protective layer 180 and the bottom surface 169b of the first hole 169 may range from about 2 μm to about 10 μm.

The bump structure 300 may include a solder pattern 310 and a pillar pattern 320, and the solder pattern 310 may be provided in the first hole 169 of the first redistribution pattern 160 so as to be in contact with the bottom surface 169b of the first hole 169 and the inner sidewall 160c of the first redistribution pattern 160. For example, a bottom surface 310b and a sidewall of the solder pattern 310 may be in contact with the first redistribution pattern 160. A contact area between the solder pattern 310 and the first redistribution pattern 160 may be increased, and thus the solder pattern 310 may be better electrically connected to the first redistribution pattern 160. The bottom surface 310b of the solder pattern 310 may be disposed at a higher level than the bottom surface 160b of the first redistribution pattern 160. The solder pattern 310 may be spaced apart from the first upper insulating layer 170.

Figure 2B:
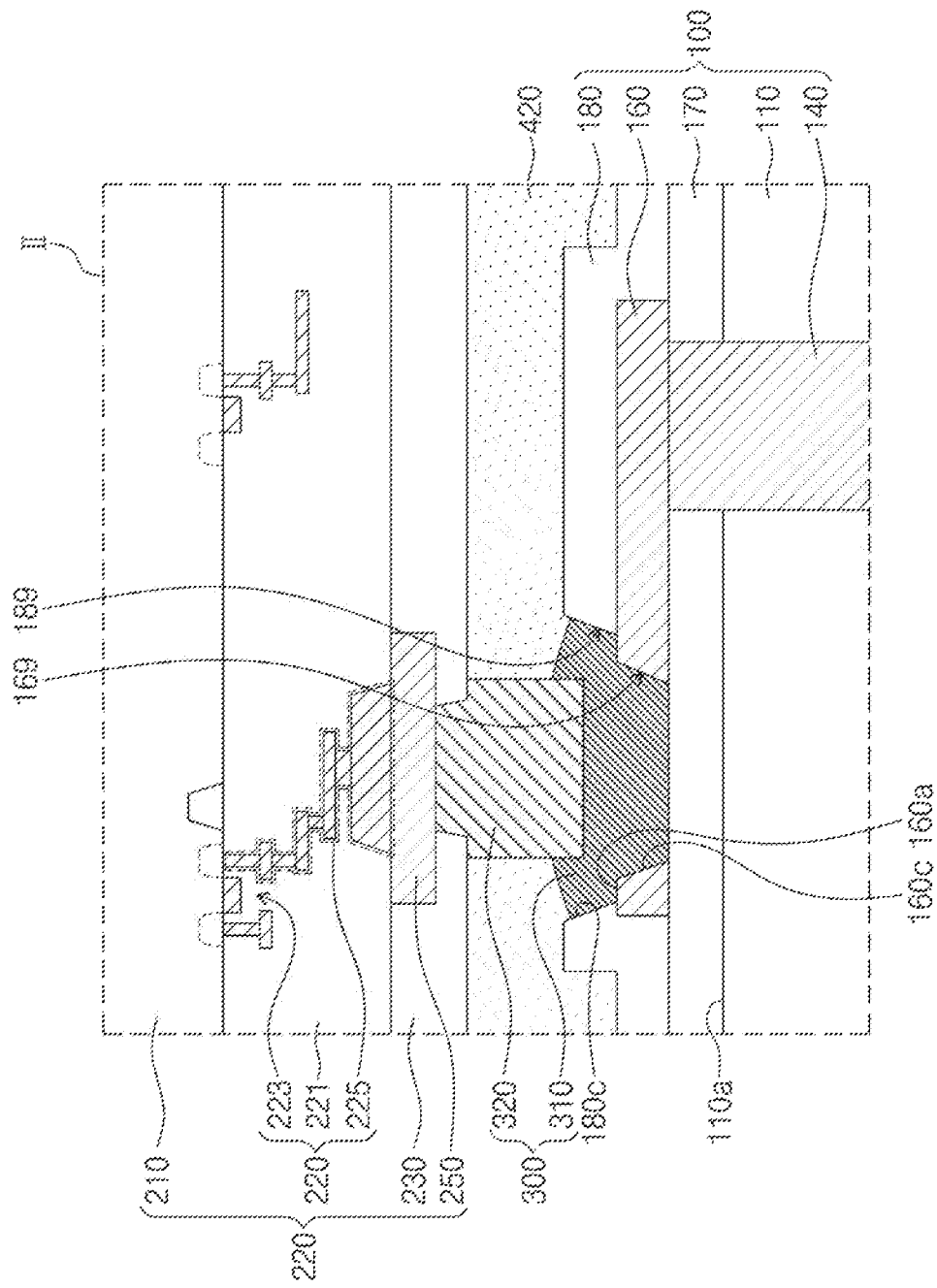
FIG. 2B is a view illustrating a first redistribution pattern and a first protective layer, according to example embodiments of the inventive concepts.

FIG. 2B is a view illustrating a first redistribution pattern and a first protective layer according to example embodiments of the inventive concepts. FIG. 2B is an enlarged view corresponding to the region 'II' of FIG. 1A and is a cross-sectional view corresponding to the line III-III' of FIG. 1C. Hereinafter, the descriptions to the same components and/or features as in the above embodiments will be omitted for the purpose of ease and convenience in explanation.

Referring to FIG. 2B, a semiconductor package may include a first semiconductor chip 100, a second semiconductor chip 200, and a bump structure 300.

A first protective layer 180 may have a first opening 189. A width of the first opening 189 may be greater than a width of the first hole 169. For example, the width of the first opening 189 at the bottom surface of the first protective layer 180 may be greater than the width of the first hole 169 at the top surface 160a of the first redistribution pattern 160. Thus, the first opening 189 may expose the top surface 160a of the first redistribution pattern 160 and the inner sidewall 180c of the first protective layer 180. The inner sidewall 180c of the first protective layer 180 may not be aligned with the inner sidewall 160c of the first redistribution pattern 160. The first hole 169 and the first opening 189 may be formed by different processes.

A solder pattern 310 may fill the first hole 169 and may be in contact with the inner sidewall 160c of the first redistribution pattern 160. The solder pattern 310 may also be provided in the first opening 189. The solder pattern 310 may extend onto the exposed top surface 160a of the first redistribution pattern 160 and the inner sidewall 180c of the first protective layer 180. Thus, a sidewall of the solder pattern 310 may have a stepped shape.

Figure 2C:
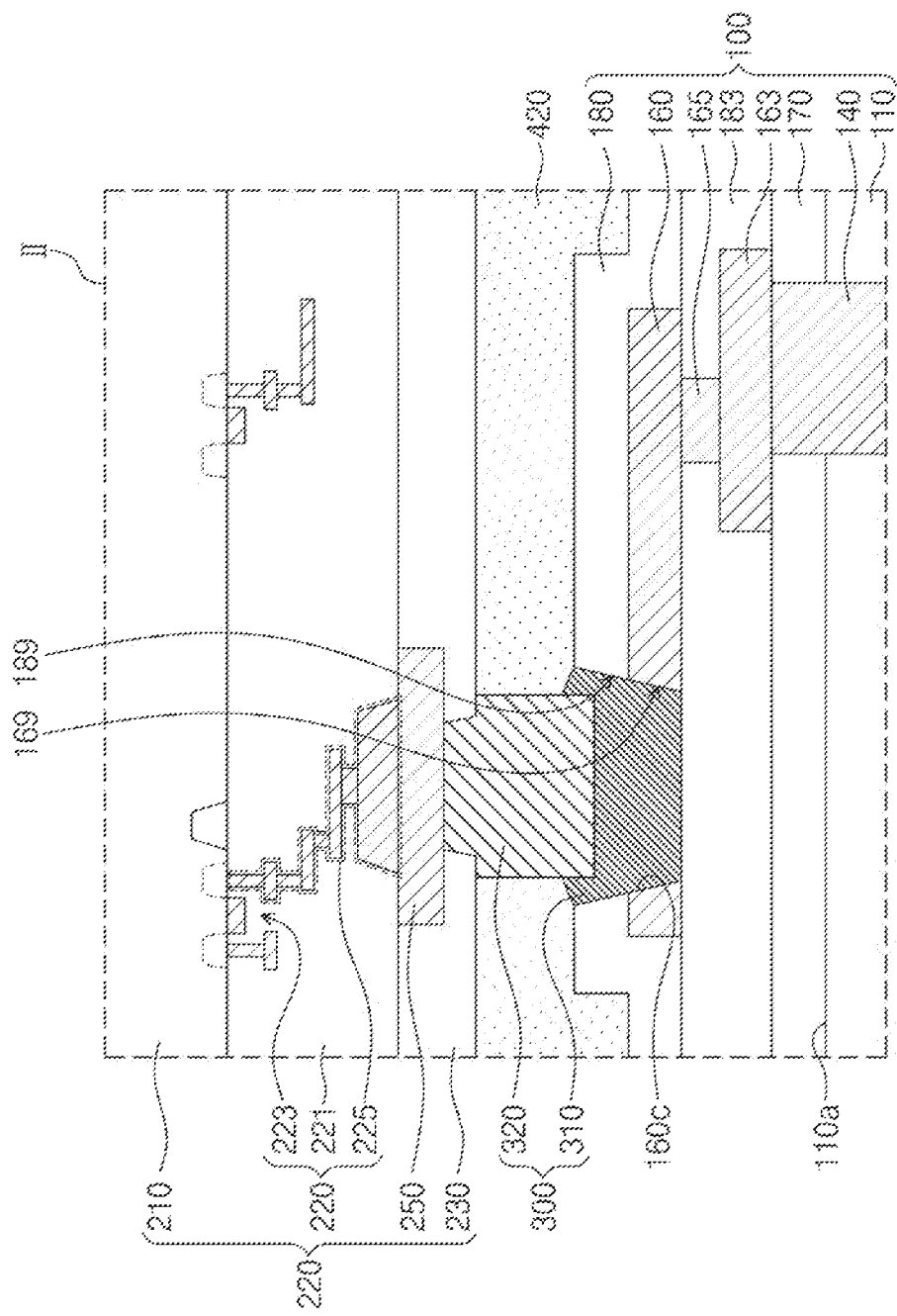
FIG. 2C is a view illustrating a semiconductor package, according to example embodiments of the inventive concepts.

FIG. 2C is a view illustrating a semiconductor package according to example embodiments of the inventive concepts. FIG. 2C is an enlarged view corresponding to the region 'II' of FIG. 1A and is a cross-sectional view corresponding to the line III-III' of FIG. 1C. Hereinafter, the descriptions to the same components and/or features as in the above embodiments will be omitted for the purpose of ease and convenience in explanation.

Referring to FIG. 2C, a semiconductor package may include a first semiconductor chip 100, a second semiconductor chip 200, and a bump structure 300. The first semiconductor chip 100 may include a first semiconductor substrate 110, a first through-structure 140, a first upper insulating layer 170, a first redistribution pattern 160, and a first protective layer 180 and may further include a first lower redistribution pattern 163 and a first lower protective layer 183. The first semiconductor substrate 110, the first through-structure 140, the first upper insulating layer 170, the first redistribution pattern 160 and the first protective layer 180 may be substantially the same as described with reference to FIGS. 1A to 1D. However, the first redistribution pattern 160 may not be in direct contact with the first through-structure 140.

The first lower redistribution pattern 163 may be disposed between the top surface 110a of the first semiconductor substrate 110 and the first redistribution pattern 160. For example, the first lower redistribution pattern 163 may be disposed between the first upper insulating layer 170 and the first redistribution pattern 160. The first lower redistribution pattern 163 may be disposed on the first through-structure 140 and may be in contact with the first through-structure 140. The first lower redistribution pattern 163 may include substantially the same material as the first redistribution pattern 160.

The first lower protective layer 183 may be disposed on the first lower redistribution pattern 163 and the first upper insulating layer 170 to cover the first lower redistribution pattern 163 and the first upper insulating layer 170. The first lower protective layer 183 may be an organic insulating layer. For example, the first lower protective layer 183 may include a photosensitive polymer or a photoimageable dielectric material. The first lower protective layer 183 may include the same material as the first protective layer 180, and an interface between the first protective layer 180 and the first lower protective layer 183 may not be visible or distinguished. However, embodiments of the inventive concepts are not limited thereto.

A conductive pattern 165 may be provided in the first lower protective layer 183 and may penetrate the first lower protective layer 183. The conductive pattern 165 may be disposed on the first lower redistribution pattern 163 and may be connected to the first lower redistribution pattern 163. The conductive pattern 165 may include, for example, a metal.

The first redistribution pattern 160 may be disposed on the first lower protective layer 183 and the conductive pattern 165. For example, the first redistribution pattern 160 may contact top surfaces of the first lower protective layer 183 and the conductive pattern 165. The first redistribution pattern 160 may be spaced apart from the first upper insulating layer 170. The first redistribution pattern 160 may be connected to the first through-structure 140 through the conductive pattern 165 and the first lower redistribution pattern 163. The first redistribution pattern 160 may have a first hole 169. The bump structure 300 may be provided in the first hole 169, and the solder pattern 310 may be in contact with the inner sidewall 160c of the first redistribution pattern 160. The first lower redistribution pattern 163 may not have the first hole 169. The bump structure 300 may be spaced apart from the first lower redistribution pattern 163.

In certain embodiments, the first lower redistribution pattern 163 may include a plurality of stacked first lower redistribution patterns 163, and the first lower protective layer 183 may include a plurality of stacked first lower protective layers 183. In this case, the first lower protective layers 183 may be disposed between the first lower redistribution patterns 163.

Figure 2D:
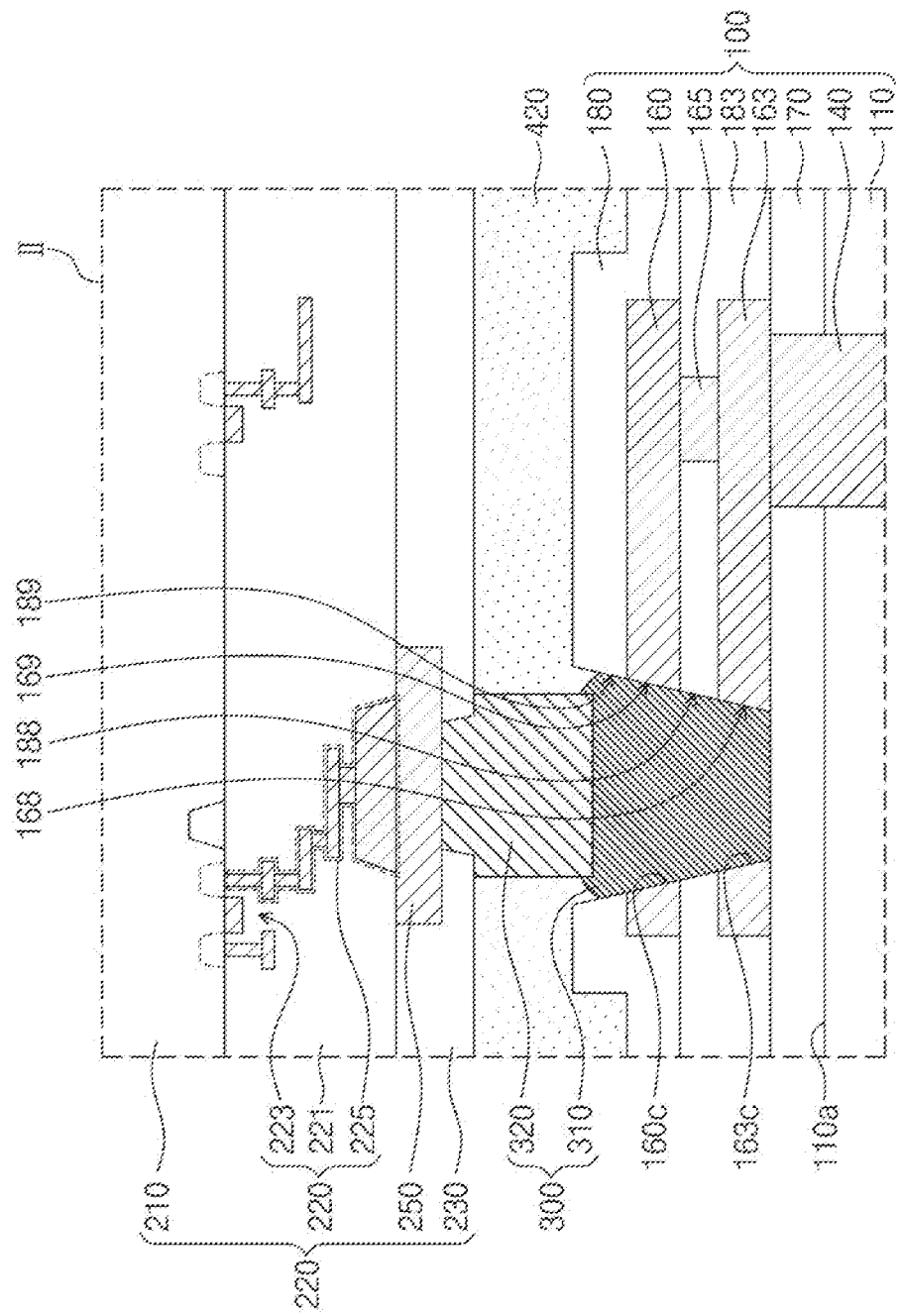
FIG. 2D is a view illustrating electrical connection of a bump structure and a first through-structure, according to example embodiments of the inventive concepts.

FIG. 2D is a view illustrating electrical connection of a bump structure and a first through-structure according to some embodiments of the inventive concepts. FIG. 2D is an enlarged view corresponding to the region 'II' of FIG. 1A and is a cross-sectional view corresponding to the line III-III' of FIG. 1C. Hereinafter, the descriptions to the same components and/or features as in the above embodiments will be omitted for the purpose of ease and convenience in explanation.

Referring to FIG. 2D, a semiconductor package may include a first semiconductor chip 100, a second semiconductor chip 200, and a bump structure 300. The first semiconductor chip 100 may include a first semiconductor substrate 110, a first through-structure 140, a first upper insulating layer 170, a first redistribution pattern 160, and a first protective layer 180 and may further include a first lower redistribution pattern 163, a first lower protective layer 183, and a conductive pattern 165. The first through-structure 140, the first redistribution pattern 160, the first protective layer 180, the first lower redistribution pattern 163, the first lower protective layer 183, and the conductive pattern 165 may be substantially the same as described with reference to FIG. 2C.

However, the first lower protective layer 183 may have a lower opening 188. The lower opening 188 may penetrate a top surface and a bottom surface of the first lower protective layer 183 and may be connected to the first hole 169 of the first redistribution pattern 160. The first lower redistribution pattern 163 may have a lower hole 168. The lower hole 168 may penetrate a top surface of the first lower redistribution pattern 163. The lower hole 168 may be connected to the first hole 169 and the first opening 189 through the lower opening 188.

The bump structure 300 may be provided in the first opening 189, the first hole 169, the lower opening 188, and the lower hole 168. The solder pattern 310 may be in contact with an inner sidewall 163c of the first lower redistribution pattern 163 and the inner sidewall 160c of the first redistribution pattern 160. The solder pattern 310 may be electrically connected to the first through-structure 140 through the first redistribution pattern 160 and the first lower redistribution pattern 163. The solder pattern 310 may also cover an inner sidewall of the first lower protective layer 183 and the inner sidewall of the first protective layer 180.

In the embodiments of FIGS. 2A to 2D, the semiconductor package may further include at least one of the package substrate 900, the molding layer 400, the first underfill layer 410, and the bonding bump 350, described in the embodiments of FIGS. 1A to 1D. The first semiconductor chip 100 may further include the first circuit layer 120 and the first lower insulating pattern 130. The embodiments of FIGS. 1A to 1D, the embodiments of FIG. 2A, the embodiments of FIG. 2B, the embodiments of FIG. 2C, and the embodiments of FIG. 2D may be combined with each other. For example, in FIGS. 2B and 2C, the first hole 169 penetrates the top surface and the bottom surface of the first redistribution pattern 160. Alternatively, the first hole 169 may penetrate the top surface of the first redistribution pattern 160 but may not penetrate the bottom surface of the first redistribution pattern 160. In this case, the bottom surface of the first hole 169 may be disposed in the first redistribution pattern 160, and the bottom surface and the sidewall of the solder pattern 310 may be in contact with the first redistribution pattern 160.

In the semiconductor packages of FIGS. 2A to 2D, a height of the bump structure 300, a distance between the first and second semiconductor chips 100 and 200, a thickness of the second underfill layer 420, and a difference in level between the top surface of the first protective layer 180 and the bottom surface of the first hole 169 may satisfy the conditions described above in the embodiments of FIGS. 1A to 1D.

Figure 3:
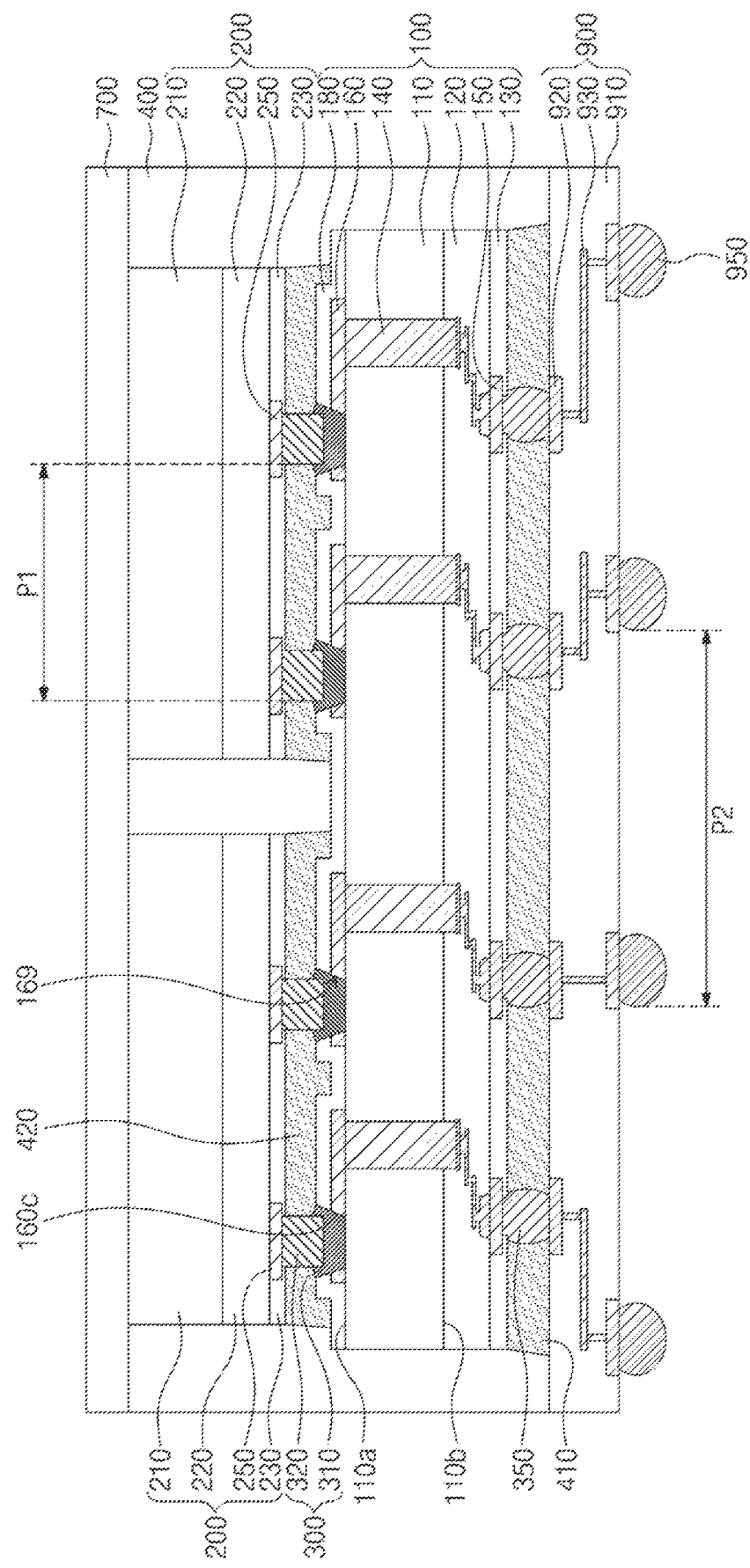
FIG. 3 is a cross-sectional view illustrating a semiconductor package, according to example embodiments of the inventive concepts.

FIG. 3 is a cross-sectional view illustrating a semiconductor package according to example embodiments of the inventive concepts. The present embodiments will be described with reference to FIGS. 3 and 1D, and the descriptions to the same components and/or features as in the above embodiments will be omitted for the purpose of ease and convenience in explanation.

Referring to FIG. 3, a semiconductor package may include a package substrate 900, a first semiconductor chip 100, a plurality of second semiconductor chips 200, and a plurality of bump structures 300. The semiconductor package may further include a plurality of external terminals 950, a molding layer 400, a first underfill layer 410, and a plurality of second underfill layers 420. The semiconductor package may be a three-dimensional (3D) stack package.

The first semiconductor chip 100 may be mounted on the package substrate 900. The first semiconductor chip 100 may include a first semiconductor substrate 110, a first circuit layer 120, a first lower insulating pattern 130, a first through-structure 140, a first redistribution pattern 160, and a first protective layer 180.

The plurality of second semiconductor chips 200 may be mounted on a top surface of the first semiconductor chip 100. The second semiconductor chips 200 may be laterally spaced apart from each other. In the present specification, the term "laterally" may mean "in a direction parallel to a top surface 110a of the first semiconductor substrate 110". A kind of the second semiconductor chips 200 may be different from a kind of the first semiconductor chip 100. For example, a size, a function and/or the number of input/output (I/O) terminal(s) of the second semiconductor chip 200 may be different from that (those) of the first semiconductor chip 100. The I/O terminal may be a chip pad. In some embodiments, a width of each of the second semiconductor chips 200 may be less than a width of the first semiconductor chip 100. Each of the second semiconductor chips 200 may perform a different function from that of the first semiconductor chip 100. For example, the first semiconductor chip 100 may be a logic chip, and the second semiconductor chips 200 may be memory chips. The memory chips may include volatile memory chips such as DRAM chips or SRAM chips. Alternatively, the memory chips may include non-volatile memory chips such as NAND flash memory chips. Each of the second semiconductor chips 200 may include a second semiconductor substrate 210, a second circuit layer 220, and second chip pads 250, as described in the embodiments of FIGS. 1A to 1D. The second semiconductor chip 200 may further include a second lower insulating pattern 230.

The bump structures 300 may be disposed between the first semiconductor chip 100 and the second semiconductor chips 200. Each of the second semiconductor chips 200 may be connected to the first semiconductor chip 100 and the package substrate 900 through the bump structures 300. Each of the bump structures 300 may include a solder pattern 310 and a pillar pattern 320. The solder pattern 310 may be provided in the first hole 169 of the first redistribution pattern 160 and may be in contact with the inner sidewall 160c of the first redistribution pattern 160. Thus, the semiconductor package may be miniaturized, and thermal properties of the semiconductor package may be improved. A pitch P1 of a plurality of the pillar patterns 320 may be less than a pitch P2 of a plurality of the external terminals 950.

The second underfill layers 420 may be respectively disposed in second gap regions between the first semiconductor chip 100 and the second semiconductor chips 200 to seal or surround the bump structures 300.

The molding layer 400 may cover sidewalls of the first and second semiconductor chips 100 and 200 but may expose top surfaces of the second semiconductor chips 200. Alternatively, the molding layer 400 may also cover the top surfaces of the second semiconductor chips 200.

The semiconductor package may further include a heat dissipation structure 700. The heat dissipation structure 700 may be disposed on the top surfaces of the second semiconductor chips 200 and a top surface of the molding layer 400. In some embodiments, the heat dissipation structure 700 may further extend onto a sidewall of the molding layer 400. The heat dissipation structure 700 may include a heat sink, a heat slug, or a thermal interface material (TIM) layer. The heat dissipation structure 700 may include, for example, a metal.

Figure 4A:
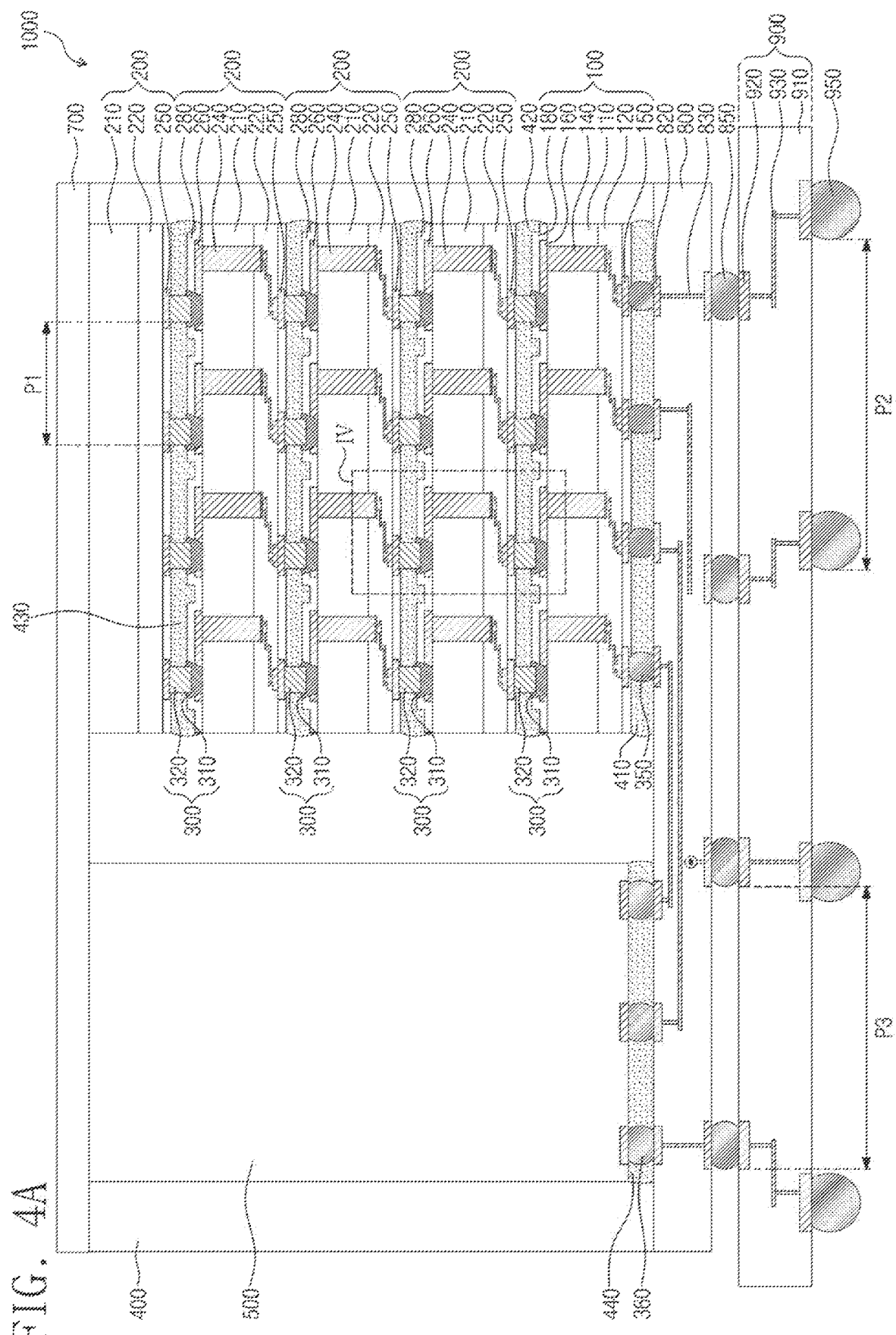
FIG. 4A is a cross-sectional view illustrating a semiconductor package, according to example embodiments of the inventive concepts.
Figure 4B:
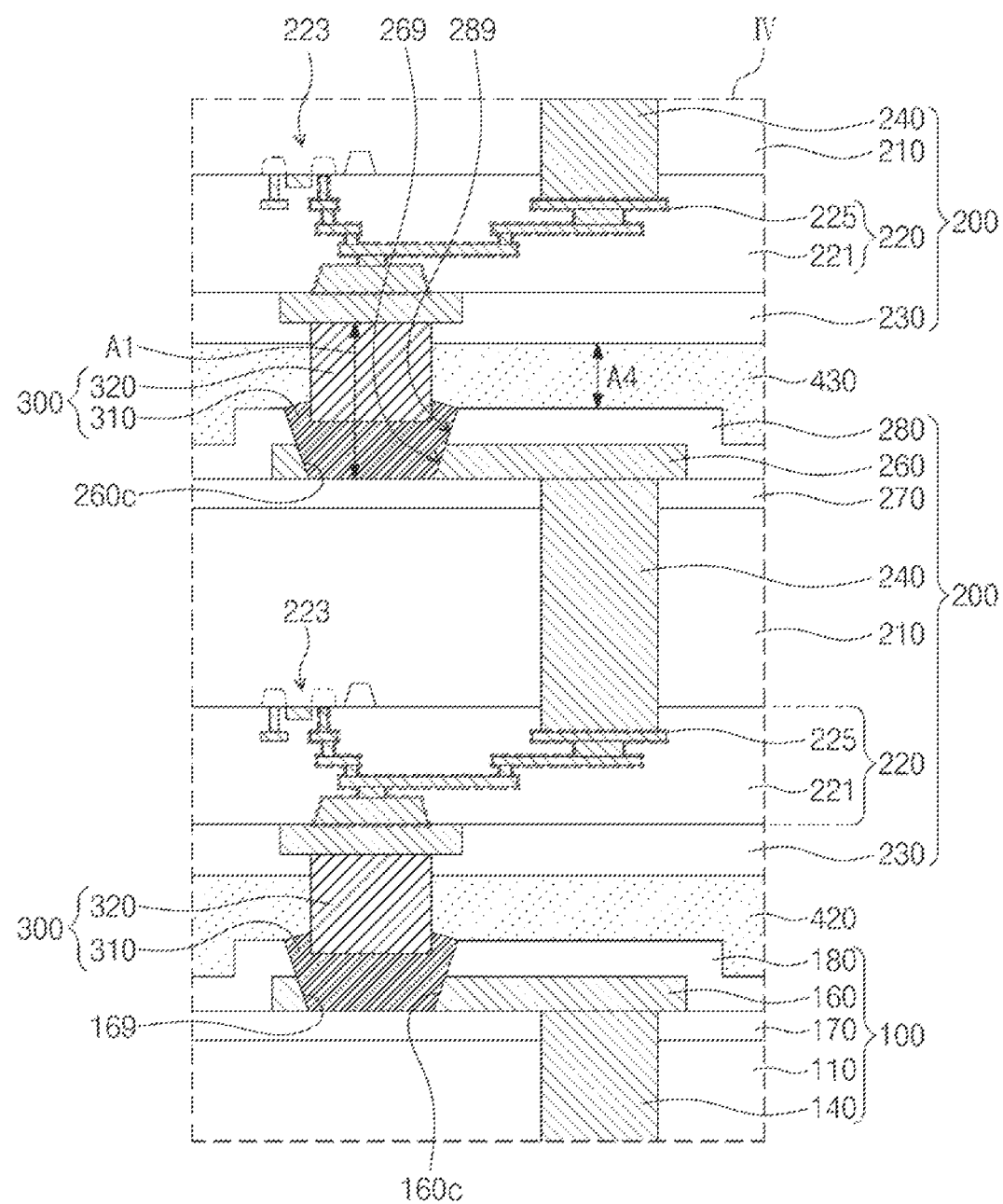
FIG. 4B is an enlarged view of a region 'IV' of FIG. 4A.

FIG. 4A is a cross-sectional view illustrating a semiconductor package according to example embodiments of the inventive concepts. FIG. 4B is an enlarged view of a region 'IV' of FIG. 4A. Hereinafter, the descriptions to the same components and/or features as in the above embodiments will be omitted for the purpose of ease and convenience in explanation.

Referring to FIGS. 4A and 4B, a semiconductor package may include a package substrate 900, external terminals 950, an interposer substrate 800, interposer bumps 850, a chip stack 1000, a third semiconductor chip 500, and a molding layer 400. The package substrate 900 may be substantially the same as described with reference to FIGS. 1A to 1D. A plurality of the external terminals 950 may be provided on a bottom surface of the package substrate 900.

The interposer substrate 800 may be disposed on the package substrate 900. The interposer substrate 800 may include metal pads 820 and metal interconnection lines 830. The metal pads 820 may be exposed at a top surface of the interposer substrate 800. The metal interconnection lines 830 may be provided in the interposer substrate 800 and may be connected to the metal pads 820. In the present specification, it may be understood that when a component is referred to as being electrically connected to the interposer substrate 800, it may be electrically connected to the metal interconnection line 830. The metal pads 820 and the metal interconnection lines 830 may include a metal such as copper, aluminum, tungsten, and/or titanium. The interposer bumps 850 may be disposed between the package substrate 900 and the interposer substrate 800 and may be connected to the package substrate 900 and the interposer substrate 800. For example, the interposer bumps 850 may be connected to the substrate pads 920 and the metal interconnection lines 830. each of the interposer bumps 850 may include a solder ball. The interposer bumps 850 may include a metal such as a solder material.

The chip stack 1000 may be mounted on the top surface of the interposer substrate 800. The chip stack 1000 may include a first semiconductor chip 100, a second semiconductor chip 200, and a plurality of bump structures 300. The first semiconductor chip 100 may be mounted on the top surface of the interposer substrate 800. The first semiconductor chip 100 may include a first semiconductor substrate 110, first chip pads 150, a first circuit layer 120, first through-structures 140, first redistribution patterns 160, and a first protective layer 180. The first semiconductor chip 100 may further include a first lower insulating pattern 130, as in FIG. 1B. Bonding bumps 350 may be disposed between the interposer substrate 800 and the first semiconductor chip 100. The bonding bumps 350 may be disposed between the metal pads 820 and the first chip pads 150 and may be connected to the metal pads 820 and the first chip pads 150.

The second semiconductor chip 200 may be disposed on a top surface of the first semiconductor chip 100. The bump structures 300 may be disposed between the first and second semiconductor chips 100 and 200. Each of the bump structures 300 may be substantially the same as described above. For example, the solder pattern 310 may be provided in the first hole 169 and may be in direct contact with the inner sidewall 160c of the first redistribution pattern 160, as illustrated in FIG. 4B. Thus, a height of the chip stack 1000 may be reduced.

The second semiconductor chip 200 may include a plurality of stacked second semiconductor chips 200. A kind of the second semiconductor chips 200 may be different from a kind of the first semiconductor chip 100. For example, the first semiconductor chip 100 may be one of a logic chip, a buffer chip, and a system-on-chip (SOC), and the second semiconductor chips 200 may be a different one of a logic chip, a memory chip, a buffer chip, and a system-on-chip (SOC). In the present specification, the memory chip may include a high bandwidth memory (HBM) chip. For an example, the first semiconductor chip 100 may be the logic chip, and the second semiconductor chips 200 may be the HBM chips.

Hereinafter, the second semiconductor chips 200 will be described in detail. Each second semiconductor chip 200 may include a second semiconductor substrate 210, a second circuit layer 220, and second chip pads 250, as described in the embodiments of FIGS. 1A to 1D. Each second semiconductor chip 200 may further include second through-structures 240, second redistribution patterns 260, a second upper insulating layer 270, and a second protective layer 280. The second through-structures 240, the second upper insulating layer 270, the second redistribution patterns 260, and the second protective layer 280 may be substantially the same as the first through-structures 140, the first upper insulating layer 170, the first redistribution patterns 160, and the first protective layer 180 described in the embodiments of FIGS. 1A to 1D, respectively. For example, the second upper insulating layer 270 may be disposed on a top surface of the second semiconductor substrate 210. The second upper insulating layer 270 may include a silicon-based insulating material. The second through-structures 240 may be disposed in the second semiconductor substrate 210. The second through-structures 240 may penetrate the second semiconductor substrate 210 and the second upper insulating layer 270. As illustrated in FIG. 4B, the second through-structures 240 may further penetrate an upper portion of the second insulating layer 221 of the second circuit layer 220 and may be connected to the second interconnection structures 225 of the second circuit layer 220. The second through-structures 240 may be electrically connected to at least one of the second chip pads 250 and the second integrated circuits 223 through the second interconnection structures 225.

The second redistribution pattern 260 may be disposed on the top surface of the second semiconductor substrate 210 and may be connected to the second through-structure 240. For example, the second redistribution pattern 260 may cover the second upper insulating layer 270 and may be in contact with top surfaces of the second through-structures 240. Each second redistribution pattern 260 may have a second hole 269. The second hole 269 may expose an inner sidewall 260c of the second redistribution pattern 260.

The second protective layer 280 may be provided on the second redistribution patterns 260. The second protective layer 280 may have second openings 289, and each second opening 289 may be connected to a corresponding one of the second holes 269. Unlike FIG. 4B, a width of a bottom end of the second opening 289 may be greater than a width of a top end of the second hole 269. In this case, the second opening 289 may expose a top surface of the second redistribution pattern 260 and an inner sidewall of the second protective layer 280. In this case, the inner sidewall of the second protective layer 280 may not be coplanar with the inner sidewall 260c of the second redistribution pattern 260. A difference in level between a top surface of the second protective layer 280 and a bottom surface of the second hole 269 may range from about 2 μm to about 10 μm.

Even though not shown in the drawings, the second semiconductor chip 200 may further include a second lower redistribution pattern and a second lower protective layer. The second lower redistribution pattern and the second lower protective layer may be substantially the same as the first lower redistribution pattern 163 and the first lower protective layer 183 described in the embodiments of FIG. 2C or 2D, respectively.

An uppermost second semiconductor chip 200 may not include the second through-structures 240, the second redistribution patterns 260, and the second protective layer 280. Each of the second semiconductor chips 200 may further include a second lower insulating pattern 230, as illustrated in FIG. 4B.

Hereinafter, electrical connection between the plurality of second semiconductor chips 200 through the bump structures 300 will be described. Other bump structures 300 may be disposed between the second semiconductor chips 200. The second semiconductor chips 200 may include a lower semiconductor chip and an upper semiconductor chip which are adjacent to each other. Here, the upper semiconductor chip may be disposed on a top surface of the lower semiconductor chip. In the bump structure 300 between the lower semiconductor chip and the upper semiconductor chip, the solder pattern 310 may be provided in the second hole 269 of the lower semiconductor chip and may be in contact with the inner sidewall 260c of a corresponding second redistribution pattern 260. Thus, a thickness of the chip stack 1000 and a thickness of the semiconductor package may be reduced. For example, a distance A4 between the second semiconductor chips 200 may be less than a height A1 of a corresponding bump structure 300. The corresponding bump structure 300 may correspond to the bump structure 300 between the second semiconductor chips 200 adjacent to each other. The distance A4 between the second semiconductor chips 200 may be a distance between the top surface of the second protective layer 280 on the second redistribution pattern 260 of the lower semiconductor chip and a bottom surface of the second lower insulating pattern 230 of the upper semiconductor chip. The distance A4 between the second semiconductor chips 200 may range from about 3 µm to about 20 µm. The height A1 of the bump structure 300 may range from about 5 µm to about 30 µm.

A bottom surface of the solder pattern 310 may be in contact with the second upper insulating layer 270. In certain embodiments, the bottom surface of the second hole 269 may be disposed in the second redistribution pattern 260. In this case, the bottom surface of the solder pattern 310 may be connected to the second redistribution pattern 260. The solder pattern 310 may be connected to the second through-structure 240 through the second redistribution pattern 260 of the lower semiconductor chip. The pillar pattern 320 may be connected to the second chip pad 250 of the upper semiconductor chip. Thus, the upper semiconductor chip and the lower semiconductor chip may be electrically connected to each other.

As illustrated in FIG. 4A, a pitch P1 of a plurality of the pillar patterns 320 may be less than a pitch P2 of the external terminals 950. The pitch P1 of the pillar patterns 320 may be less than a pitch P3 of a plurality of the interposer bumps 850.

The semiconductor package may further include a first underfill layer 410, a second underfill layer 420, a third underfill layer 430, and a fourth underfill layer 440. The first underfill layer 410 and the second underfill layer 420 may be substantially the same as described with reference to FIGS. 1A to 1D.

The third underfill layer 430 may be disposed in a third gap region between the second semiconductor chips 200. For example, the third underfill layer 430 may be disposed between the second semiconductor chips 200 to seal or surround a corresponding bump structures 300. The distance between the second semiconductor chips may be substantially equal to a thickness of a corresponding third underfill layer 430. The thickness of the third underfill layer 430 may be less than the height A1 of the corresponding bump structure 300. For example, the thickness of the third underfill layer 430 may range from about 3 µm to about 20 µm. The thickness of the third underfill layer 430 may be equal to a distance between the bottom surface of the second lower insulating pattern 230 of the upper semiconductor chip and the top surface of the second protective layer 280 on the second redistribution pattern 260 of the lower semiconductor chip. The third underfill layer 430 may include an insulating polymer. For example, the third underfill layer 430 may include an epoxy-based polymer.

The third semiconductor chip 500 may be mounted on the top surface of the interposer substrate 800. The third semiconductor chip 500 may be laterally spaced apart from the chip stack 1000. The third semiconductor chip 500 may include a central processing unit (CPU) or a graphic processing unit (GPU). Connection bump 360 may be provided between chip pads of the third semiconductor chip 500 and corresponding metal pads 820. each of the connection bumps 360 may include at least one of a solder ball or a pillar. The connection bumps 360 may include a metal such as a solder material. The third semiconductor chip 500 may be electrically connected to the first semiconductor chip 100, the second semiconductor chips 200 and/or the external terminals 950 through the connection bumps 360 and the metal interconnection lines 830.

The fourth underfill layer 440 may be disposed in a fourth gap region between the interposer substrate 800 and the third semiconductor chip 500. The fourth underfill layer 440 may seal or surround the connection bump 360. The fourth underfill layer 440 may include an epoxy-based polymer.

The molding layer 400 may cover sidewalls of the first and second semiconductor chips 100 and 200 and a sidewall of the third semiconductor chip 500. The molding layer 400 may expose a top surface of an uppermost one of the second semiconductor chips 200 and a top surface of the third semiconductor chip 500. Alternatively, the molding layer 400 may also cover the top surface of the uppermost second semiconductor chip 200 and/or the top surface of the third semiconductor chip 500. The molding layer 400 may include an epoxy-based polymer. In some embodiments, the molding layer 400 may include a different material from that of the first to fourth underfill layers 410, 420, 430 and 440.

The semiconductor package may further include a heat dissipation structure 700. The heat dissipation structure 700 may be disposed on the top surface of the uppermost second semiconductor chip 200, the top surface of the third semiconductor chip 500, and a top surface of the molding layer 400. In some embodiments, the heat dissipation structure 700 may further extend onto a sidewall of the molding layer 400.

In the semiconductor package of FIG. 3 and the semiconductor package of FIGS. 4A and 4B, the package substrate 900, the molding layer 400, the first underfill layer 410, and the second underfill layer 420 may be substantially the same as described in the embodiments of FIGS. 1A to 1D. The first semiconductor substrate 110, the first circuit layer 120, the first through-structures 140, the first redistribution patterns 160, the first protective layer 180, and the bump structures 300 may be substantially the same as described in the embodiments of FIGS. 1A to 1D. In certain embodiments, the first redistribution patterns 160 and the bump structures 300 may be substantially the same as described in the embodiments of FIG. 2A. In certain embodiments, the first redistribution patterns 160 and the first protective layer 180 may be substantially the same as described in the embodiments of FIG. 2B. In certain embodiments, the first semiconductor chip 100 may further include the first lower redistribution pattern and the first lower protective layer, as described in the embodiments of FIG. 2C or 2D.

According to the embodiments of the inventive concepts, the bump structure may be disposed between the first semiconductor chip and the second semiconductor chip. The first semiconductor chip may include the first redistribution pattern having the first hole. The bump structure may be disposed in the first hole and may be in contact with the inner sidewall of the first redistribution pattern. The bottom surface of the bump structure may be disposed at a lower level than the top surface of the first redistribution pattern. Thus, the distance between the first and second semiconductor chips may be reduced, and the semiconductor package may be miniaturized.

Since the bump structure is disposed in the first hole, occurrence of an electrical short between the bump structures may be inhibited or prevented. The thickness of the underfill layer between the first and second semiconductor chips may be reduced, and thus the heat dissipation property of the semiconductor package may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
    a first semiconductor chip comprising a semiconductor substrate and a redistribution pattern on a top surface of the semiconductor substrate, the redistribution pattern having a hole exposing an inner sidewall of the redistribution pattern;
    a second semiconductor chip on a top surface of the first semiconductor chip; and
    a bump structure disposed between the first semiconductor chip and the second semiconductor chip,
    wherein the bump structure comprises a solder pattern filling the hole and being in direct contact with the inner sidewall of the redistribution pattern,
    wherein a distance between the first and second semiconductor chips is less than a height of the bump structure,
    wherein the distance between the first and second semiconductor chips ranges from about 3 μm to about 20 μm, and
    wherein the height of the bump structure ranges from about 5 μm to about 30 μm.

2. The semiconductor package of claim 1,
    wherein the first semiconductor chip further comprises a protective layer disposed on the redistribution pattern and having an opening, and
    wherein the opening is connected to the hole and exposes an inner sidewall of the protective layer.

3. The semiconductor package of claim 2, wherein the solder pattern covers the inner sidewall of the protective layer.

4. The semiconductor package of claim 2, wherein a distance between a top surface of the protective layer and a bottom surface of the hole ranges from about 2 μm to about 10 μm.

5. The semiconductor package of claim 2, wherein the bump structure further comprises a pillar pattern disposed between the solder pattern and a chip pad of the second semiconductor chip.

6. The semiconductor package of claim 5, wherein a bottom surface of the pillar pattern is disposed at a lower level than a top surface of the protective layer.

7. The semiconductor package of claim 1, further comprising:
    an underfill layer disposed in a gap region between the first and second semiconductor chips and covering the bump structure.

8. The semiconductor package of claim 7, wherein a thickness of the underfill layer is less than a height of the bump structure.

9. The semiconductor package of claim 7, wherein the underfill layer has a thermal conductivity lower than a thermal conductivity of the bump structure.

10. A semiconductor package comprising:
    a first semiconductor chip comprising a semiconductor substrate, an insulating layer on the semiconductor substrate, and a redistribution pattern on the insulating layer, the redistribution pattern having a hole exposing an inner sidewall of the redistribution pattern;
    a second semiconductor chip on a top surface of the first semiconductor chip; and
    a bump structure disposed between the first semiconductor chip and the second semiconductor chip,
    wherein the bump structure comprises a solder pattern filling the hole and being in direct contact with the inner sidewall of the redistribution pattern,
    wherein a bottom surface of the hole is provided in the redistribution pattern,
    wherein a bottom surface and a sidewall of the solder pattern are in contact with the redistribution pattern, and
    wherein the bottom surface of the solder pattern is spaced apart from the insulating layer.

11. The semiconductor package of claim 10, wherein the bottom surface of the solder pattern is disposed at a higher level than a bottom surface of the redistribution pattern.

12. The semiconductor package of claim 10,
    wherein the first semiconductor chip further comprises a through-structure in the semiconductor substrate, and
    wherein the redistribution pattern is electrically connected to the through-structure.

13. The semiconductor package of claim 12, wherein the bump structure is spaced apart from the through-structure when viewed in a plan view.

14. The semiconductor package of claim 10,
    wherein the first semiconductor chip further comprises a protective layer disposed on the redistribution pattern and having an opening, and
    wherein a width of the opening is greater than a width of the hole.

15. The semiconductor package of claim 14, wherein the sidewall of the solder pattern has a stepped shape.

16. A semiconductor package comprising:
    a first semiconductor chip comprising a semiconductor substrate, a lower redistribution pattern, a lower protective layer, and an upper redistribution pattern sequentially stacked;
    a second semiconductor chip on a top surface of the first semiconductor chip;
    a solder pattern in direct contact with an inner sidewall of the lower redistribution pattern, an inner sidewall of the lower protective layer and an inner sidewall of the upper redistribution pattern; and
    a pillar pattern disposed between the solder pattern and the second semiconductor chip,
    wherein the solder pattern has a horizontal width that decreases from an upper surface of the upper redistribution pattern toward an upper surface of the semiconductor substrate.

17. The semiconductor package of claim 16,
    wherein the lower redistribution pattern has a lower hole, the lower protective layer has a lower opening, and the upper redistribution pattern has an upper hole, and wherein the lower hole, the lower opening, and the upper hole are connected to each other.

18. The semiconductor package of claim 17, wherein the solder pattern is disposed in the lower hole, the lower opening, and the upper hole.

\* \* \* \* \*